United States Patent
Fantini et al.

(10) Patent No.: US 11,282,895 B2
(45) Date of Patent: Mar. 22, 2022

(54) SPLIT PILLAR ARCHITECTURES FOR MEMORY DEVICES

(71) Applicant: Micron Technology, Inc., Boise, ID (US)

(72) Inventors: Paolo Fantini, Vimercate (IT); Fabio Pellizzer, Boise, ID (US); Lorenzo Fratin, Buccinasco (IT)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 16/460,875

(22) Filed: Jul. 2, 2019

(65) Prior Publication Data
US 2021/0005665 A1   Jan. 7, 2021

(51) Int. Cl.
*H01L 27/24* (2006.01)
*H01L 45/00* (2006.01)
*H01L 27/112* (2006.01)

(52) U.S. Cl.
CPC ...... *H01L 27/2481* (2013.01); *H01L 27/1128* (2013.01); *H01L 27/249* (2013.01); *H01L 45/1233* (2013.01); *H01L 45/1608* (2013.01)

(58) Field of Classification Search
CPC ............... H01L 27/2481; H01L 27/249; H01L 45/1233; H01L 45/1608; H01L 27/11578–11582; H01L 27/1128; H01L 45/06
See application file for complete search history.

(56) References Cited

U.S. PATENT DOCUMENTS

| | | |
|---|---|---|
| 2010/0091558 A1 | 4/2010 | Lee et al. |
| 2010/0270529 A1 | 10/2010 | Lung |
| 2013/0229846 A1* | 9/2013 | Chien ............... G11C 13/0002 365/51 |
| 2016/0133671 A1 | 5/2016 | Fantini et al. |
| 2017/0373084 A1 | 12/2017 | Shim et al. |
| 2019/0296079 A1* | 9/2019 | Murakami ........ H01L 27/11565 |

FOREIGN PATENT DOCUMENTS

WO    2018208719 A1    11/2018

OTHER PUBLICATIONS

ISA/KR, International Search Report and Written Opinion of the International Searching Authority, Int'l Appl. No. PCT/US2020/05689, Sep. 11, 2020, Korean Intellectual Property Office, Seo-gu, Daejeon, Republic of Korea, 13 pgs.

* cited by examiner

*Primary Examiner* — Jose R Diaz
(74) *Attorney, Agent, or Firm* — Holland & Hart LLP

(57) ABSTRACT

Methods, systems, and devices for split pillar architectures for memory devices are described. A memory device may include a substrate arranged with conductive contacts in a pattern and openings through alternative layers of conductive and insulative material that may decrease the spacing between the openings while maintaining a dielectric thickness to sustain the voltage to be applied to the array. After etching material, an insulative material may be deposited in a trench. Portions of the insulative material may be removed to form openings, into which cell material is deposited. Conductive pillars may extend perpendicular to the planes of the conductive material and the substrate, and couple to conductive contacts. The conductive pillars may be divided to form first and second pillars.

14 Claims, 15 Drawing Sheets

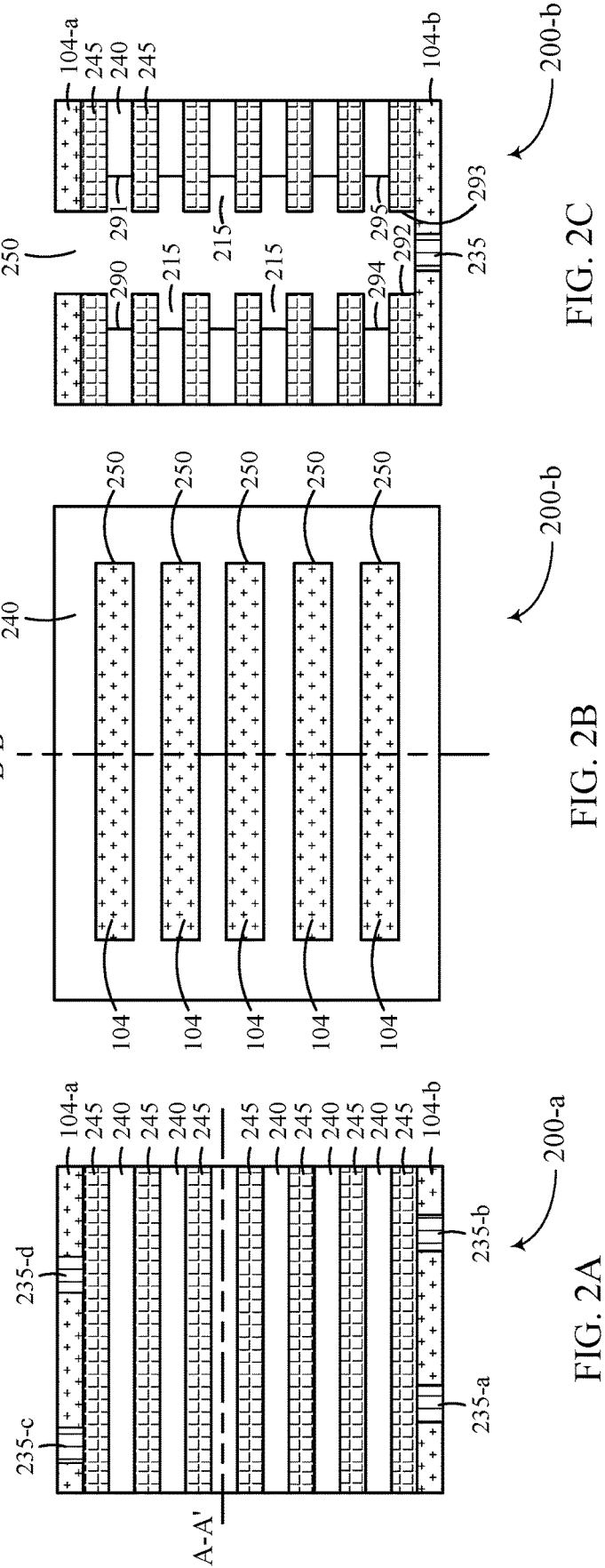

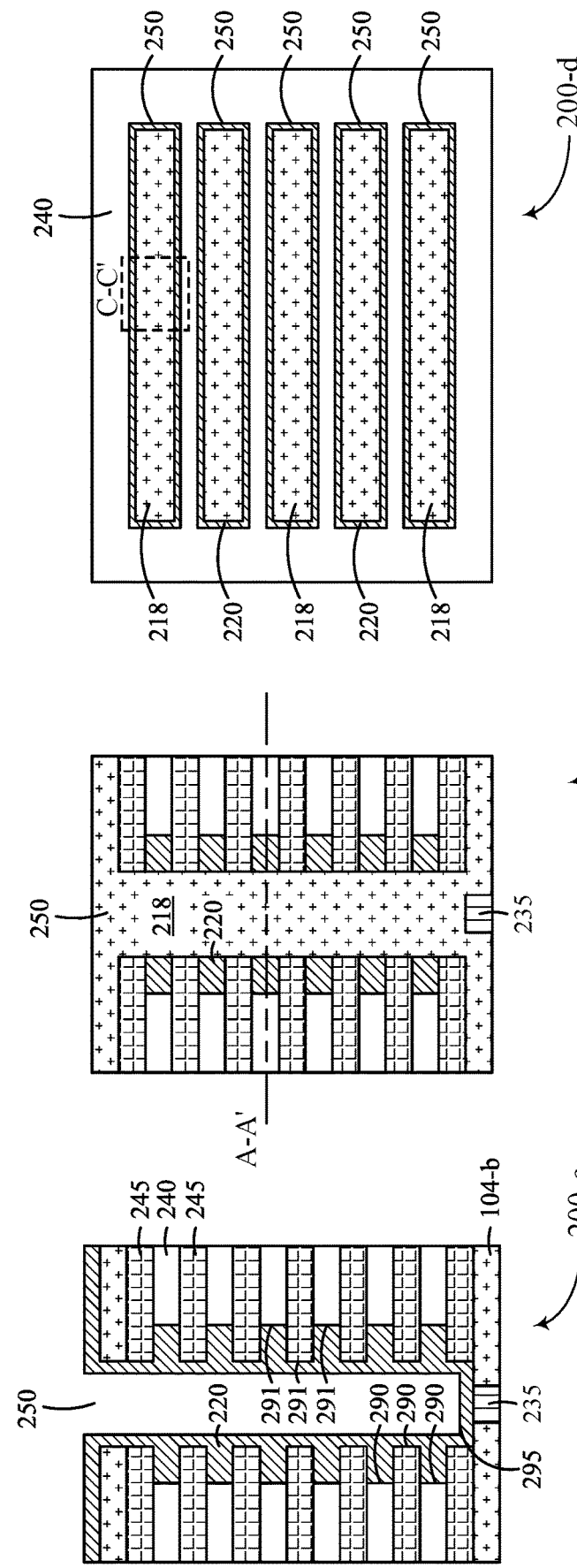

SPLIT PILLAR ARCHITECTURES FOR MEMORY DEVICES

BACKGROUND

The following relates generally to a system that includes at least one memory device and more specifically to split pillar architectures for memory devices.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide-based memories, and others. Memory devices may be volatile or non-volatile.

Improving memory devices, generally, may include increasing memory cell density, increasing read/write speeds, increasing reliability, increasing data retention, reducing power consumption, or reducing manufacturing costs, among other metrics. Solutions for saving space in the memory array, increasing the memory cell density, or decreasing overall power usage of the memory array with three-dimensional vertical architecture may be desired.

BRIEF DESCRIPTION OF THE DRAWINGS

FIGS. 2A through 2F illustrate various views of example memory arrays that support split pillar architectures for memory devices in accordance with examples as disclosed herein.

DETAILED DESCRIPTION

Figure 1:
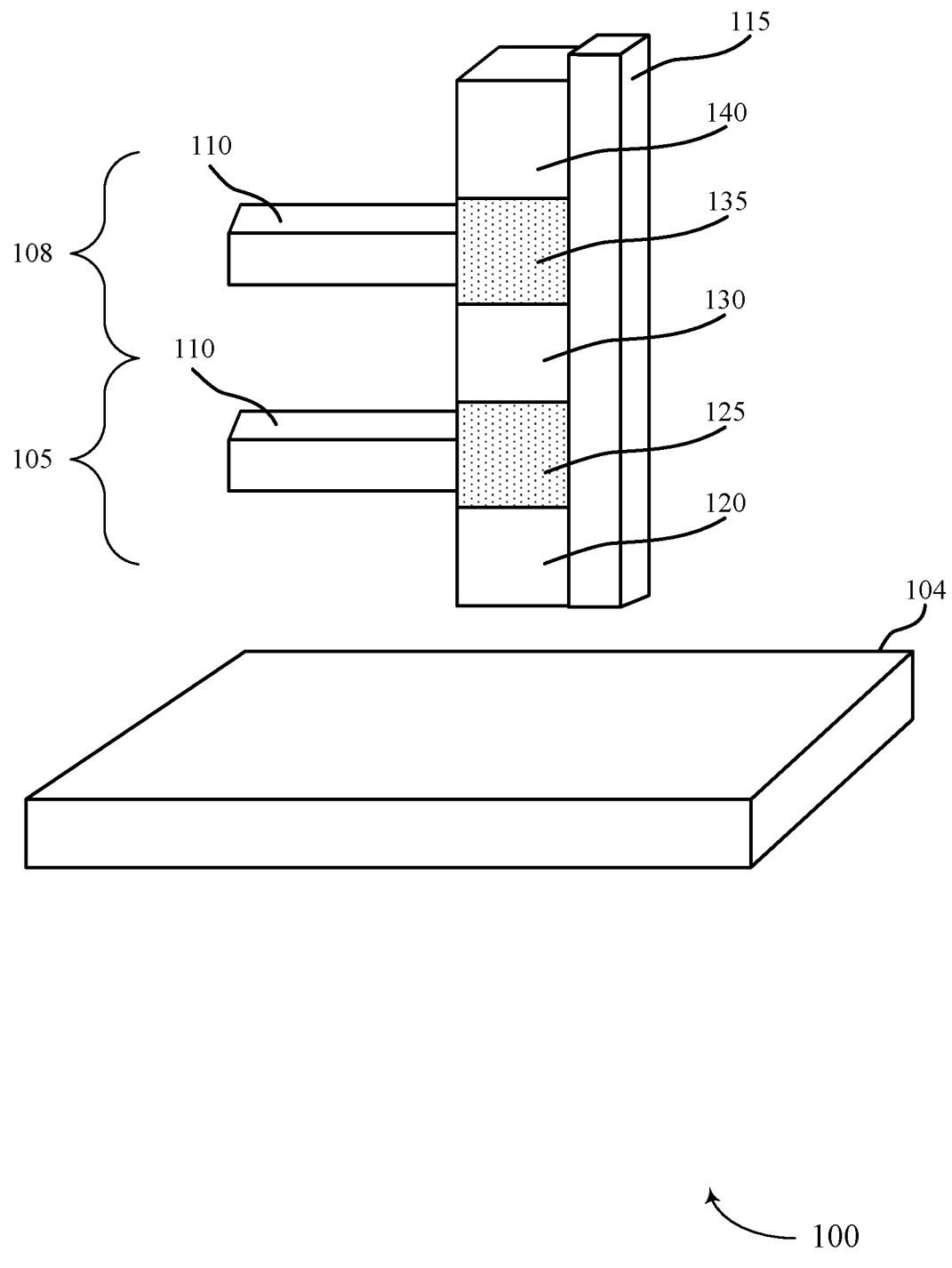
FIG. 1 illustrates an example of a system that supports split pillar architectures for memory devices in accordance with examples as disclosed herein.

The present disclosure relates to split pillar architectures for memory devices, and methods of processing the same. The memory device may include an arrangement of conductive contacts and openings through alternative layers of conductive materials and insulative material that may decrease the spacing between the memory cells while maintaining a dielectric thickness to sustain the voltage to be applied to a memory array of the memory device.

In some examples, a memory device may include a substrate with a set of contacts arranged in a pattern (e.g., a geometric pattern) and a first insulative material (e.g., a dielectric material) formed on the substrate. A set of planes of a conductive material may be separated from one another by a second insulative material (e.g., a dielectric material) and formed on the substrate material. That is, alternating planes of the conductive material and insulative material may be formed on the substrate. The planes of conductive material may be examples of word lines.

During manufacturing of the memory device, one or more trenches may be formed by etching the alternating planes of the conductive material and the insulative material. The trenches may extend parallel to each other and expose the substrate. In some examples the planes of the conductive material and the dielectric materials may form the sidewalls of the trench. The planes of the conductive material may be etched in such a way that the planes of dielectric materials and the conductive materials form a set of recesses, where each recess may be configured to receive a storage element material (e.g., a chalcogenide material). A sacrificial layer (e.g., a conformal material) may be deposited in the trench and, in some cases, the sacrificial layer fills the recesses. An insulative material may be deposited in the trench on top of the sacrificial layer.

Portions of the sacrificial layer and the insulative may be removed to form first openings. The first openings may expose portions of the substrate, at least some of the set of conductive contacts, and portions of the planes of conductive material and the planes of dielectric material. A storage element material (e.g., the chalcogenide material) may be deposited in the first openings. The storage element material may fill the recesses formed by the planes of dielectric material and the planes of conductive material. The storage element material may be partially removed from the first openings such that the storage element materials in the recesses remain. The storage element material positioned in a recess may be a storage element component (e.g., a chalcogenide component).

Conductive pillars may be formed in the first openings that include the storage components in the recesses. The conductive pillars may be arranged to extend through the planes of the conductive material (e.g., substantially perpendicularly to the planes of the conductive material) and to contact the substrate. Each conductive pillar may contact two storage element components that in turn each contact a same plane of conductive material. Each conductive pillar may further be coupled with one or two conductive contacts. In some cases, the pillars may be formed of a barrier material and a conductive material.

Portions of the conductive pillars may be removed to form second openings. The second openings may divide each pillar into a first pillar and a second pillar. The first and second pillars may be examples of digit lines. The first pillar may be in contact with a first storage element component coupled to a plane of conductive material and the second pillar may be in contact with a second storage element component coupled to the plane of conductive material. In some cases, each of the first pillars and the second pillars may be coupled with a different conductive contact on the substrate. In some other cases, each of the first pillars may be coupled with a different conductive contact on the substrate and each of the second pillars may be coupled with a different conductive contact on a second substrate formed above the first substrate.

Such configurations of a memory array and the methods of manufacturing may allow a higher-density of memory cells relative to previous solutions. Each memory cell (e.g., storage component) may be recessed inside either a first pillar or a second pillar to ensure the cell isolation. Such a configuration may allow for a tighter control of cell thickness and dimension with respect to some previous solutions. Each plane of conductive material that intersects the conductive pillar may form two memory cells addressed by a word line plate (e.g., corresponding to the plane of conductive material) and a first digit line (e.g., corresponding to a first pillar) for the first memory cell and a second digit line (e.g., corresponding to a second pillar) for the second memory cell. Each pillar may be decoded by a transistor positioned at the bottom or top of the memory array. The transistor may be an example of a digit line selector formed in a regular matrix.

Features of the disclosure are initially described in the context of a memory array as described with reference to FIG. 1. Features of the disclosure are described in the context of different views of example memory arrays during processing steps as described with reference to FIGS. 2A-8B. These and other features of the disclosure are further illustrated by and described with reference to flowcharts that relate to split pillar architectures for memory devices as described with references to FIGS. 9-11.

FIG. 1 illustrates an example of a memory array 100 (e.g., a three-dimensional (3D) memory array) that supports split pillar architectures for memory devices in accordance with examples as disclosed herein. Memory array 100 may include a first array or deck 105 of memory cells that is positioned above a substrate 104 and a second array or deck 108 of memory cells on top of the first array or deck 105.

Memory array 100 may include word lines 110 and digit lines 115. Memory cells of the first deck 105 and the second deck 108 each may have one or more self-selecting memory cells. Although some elements included in FIG. 1 are labeled with a numeric indicator, other corresponding elements are not labeled, though they are the same or would be understood to be similar.

A stack of memory cells may include a first dielectric material 120, a storage element material 125 (e.g., chalcogenide material), a second dielectric material 130, a storage element material 135 (e.g., chalcogenide material), and a third dielectric material 140. The self-selecting memory cells of the first deck 105 and second deck 108 may, in some examples, have common conductive lines such that corresponding self-selecting memory cells of each deck 105 and 108 may share digit lines 115 or word lines 110.

In some examples, a memory cell may be programmed by providing an electric pulse to the cell, which may include a memory storage element. The pulse may be provided via a first access line (e.g., word line 110) or a second access line (e.g., digit line 115), or a combination thereof. In some cases, upon providing the pulse, ions may migrate within the memory storage element, depending on the polarity of the memory cell. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

The architecture of memory array 100 may be referred to as a cross-point architecture, in some cases, in which a memory cell is formed at a topological cross-point between a word line 110 and a digit line 115. Such a cross-point architecture may offer relatively high-density data storage with lower production costs compared to other memory architectures. For example, the cross-point architecture may have memory cells with a reduced area and, resultantly, an increased memory cell density compared to other architectures.

While the example of FIG. 1 shows two memory decks 105 and 108, other configurations are possible. In some examples, a single memory deck of self-selecting memory cells may be constructed above a substrate 104, which may be referred to as a two-dimensional memory. In some examples, a three or four memory decks of memory cells may be configured in a similar manner in a three-dimensional cross point architecture.

The memory array 100 may include a substrate 104 with a set of contacts arranged in a grid or staggered pattern. In some cases, the set of contacts may extend through the substrate and couple with an access line of the memory array 100. The memory array 100 may include an additional substrate 104 (e.g., positioned above the two decks 105 and 108. The additional substrate 104 may have a set of contacts (e.g., extending through the substrate) and coupled with an access line of the memory array 100.

The memory array 100 may include a set of planes of a conductive material separated by one another by a second insulative material formed on the first insulative material on the substrate material. Each of the set of planes of the conductive material may include a set of recesses formed therein. The set of planes, for example, word line plates corresponding to one or more word lines 110 on a same deck (e.g., memory deck 105, memory deck 108), may be obtained by a replacement process by using a sacrificial layer (e.g., a conformal layer) for etching during a stack deposition processing step, removing the conformal layer after cell definition and replacing the conformal layer with a more conductive material.

A set of conductive pillars may be formed in openings to extend substantially perpendicular to the set of planes of the conductive material and the substrate. The set of conductive pillars may be divided into a set of pillar pairs. Each pillar in the pair of pillars may be coupled to a different one of the conductive contacts. In some cases, each pillar in the pair of pillars may be coupled to a conductive contact on substrate 104. Additionally or alternatively, one pillar of each pair of pillars may be coupled to a conductive contact on the substrate 104 and the other pillar of each pair of pillars may be coupled to a conductive contact on a different substrate 104 (e.g., positioned above the memory decks 105 and 108).

In some examples, the memory decks 105 and 108 may include chalcogenide material configured to store logic states. For example, the memory cells of the memory decks 105 and 108 may be examples of self-selecting memory cells. A chalcogenide material may be formed in the set of recesses such that the chalcogenide material in each respective one of the set of recesses is at least partially in contact with one pillar of the set of pairs of pillars.

FIGS. 2A-2F illustrate various views of example memory arrays 200-a, 200-b, 200-c, and 200-d during a series of steps or processes that may be performed to form a stacked memory device, in accordance with examples as disclosed herein. Specifically, in FIGS. 2A-2F, a process of forming word line planes, depositing a sacrificial layer, and an insulative material is shown.

FIG. 2A illustrates a side view of an example memory array 200-a. FIG. 2B illustrates a top view of an example memory array 200-b along a section line A-A' of FIG. 2A during a process step subsequent to what is illustrated in FIG. 2A. FIG. 2C illustrates a cross-sectional view of memory array 200-b (e.g., as shown in FIG. 2B) taken along a section line B-B' of FIG. 2B. FIG. 2D illustrates a cross-sectional view of memory array 200-c taken along section line B-B' of FIG. 2B during a process step subsequent to what is illustrated in FIGS. 2B and 2C. FIG. 2E illustrates a cross-sectional view of memory array 200-d taken along section line B-B' of FIG. 2B during a process step subsequent to what is illustrated in FIG. 2D. FIG. 2F illustrates a top view of an example memory array 200-d (e.g., as shown in FIG. 2D) along a section line A-A' of FIG. 2E.

FIG. 2A illustrates a side view of an example memory array 200-a in accordance with examples as disclosed herein. The memory array 200-a may include a set of conductive contacts 235 that extend through the substrates 104-a or 104-b. The memory array 200-a may further include alternating layers of material 240 and insulative material 245 (e.g., an insulative material layer, a dielectric layer). In some cases, the material 240 may be a conductive material (e.g., to form a conductive layer). In other cases, the material 240 may be a sacrificial insulative material (e.g., different than insulative material 245).

The substrate 104 may be a dielectric material, such as a dielectric film. A single conductive contact of the set of conductive contacts 235 may be configured to couple any single vertical pillar (e.g., a digit line) with a transistor (e.g., a digit line selector).

In some examples, conductive contacts 235 may be formed in both substrates 104-a and 104-b. For example, conductive contact 235-a may couple a first pillar of a pair of pillars (e.g., corresponding to a digit line) to a transistor. Conductive contact 235-c may couple a second pillar of the pair of pillars to a transistor. Conductive contact 235-b and conductive contact 235-d may each couple one pillar of a second pair of pillars to transistors. Additionally or alternatively, each of the conductive contacts 235 may extend through the substrate 104-b (e.g., conductive contacts 235-c and 235-d may be formed through the substrate 104-b). For example, conductive contact 235-a may couple a first pillar of a pair of pillars to a transistor and contact 235-b may couple a second pillar of the pair of pillars to a transistor.

The set of conductive contacts 235 may be arranged in a grid pattern. In some examples, a respective one of the set of conductive contacts 235 may be surrounded by up to eight other conductive contacts 235. Additionally or alternatively, the set of conductive contacts 235 may be arranged in a staggered pattern or a hexagonal pattern. For example, a respective one of the set of conductive contacts 235 may be surrounded by up to six other conductive contacts 235.

The memory array 200-a may also include a set of stacked planes of insulative material 245 and a set of stacked planes of a material 240 (e.g., word lines planes or word line plates), where the material 240 may be a conductive material or an insulative material (e.g., to be replaced by a conductive material during a process step subsequent to what is illustrated in FIG. 2A). The stacked planes of material 240 may be separated in a z-direction (e.g., separated vertically) from one another by the set of planes of the insulative material 245. For example, a first plane (e.g., a bottom plane) of the second insulative material 245 may be formed (e.g., deposited) on the plane of the substrate 104-b, and then a plane of the material 240 may be formed on the first plane of the second insulative material 245. In some examples, a layer of the first insulative material 245 may be deposited on the substrate 104-b. In some examples, the material 240 may be a layer of conductive carbon or other conductive layer compatible with active materials. In some examples, the material 240 may include conductive layers separated by active material through a protective barrier. Each layer of the material 240 may be configured to function as at least one word line plate. In some examples, the material 240 and the insulative material 245 form a set of layers, such as alternating layers.

Alternatively, the material 240 may be a sacrificial insulative material. Here, the memory array 200-a may include a set of stacked planes of the sacrificial insulative material 240 and a set of stacked planes of the insulative material 245. The sacrificial insulative material 240 may be a different material than the insulative material 245 (e.g., an oxide material and a nitride material, respectively). During a process step subsequent to what is illustrated in FIG. 2A, the sacrificial insulative material 240 may be removed and replaced by a conductive material (e.g., a layer of conductive carbon or other conductive layer compatible with active materials).

Additional planes of the second insulative material 245 may be formed on the material 240 in an alternating manner as illustrated in FIG. 2A. The second insulative material 245 may be a dielectric material, such as a dielectric film or layer. In some examples, the second insulative material 245 and the substrate 104-a may be the same type of insulative material. Examples of the insulative materials disclosed herein include, but are not limited to dielectric materials, such as silicon oxide.

Each respective one of the set of planes of the material 240 may be at (e.g., form) a different level of the memory array 200-a. Individual planes of material that form memory cells may be referred to as a deck of the 3D memory array 200-a. The material 240 (e.g., a conductive material) may comprise (e.g., be formed of) a metallic (or semi-metallic) material or a semiconductor material such as a doped polysilicon material, among others. In some examples, the material 240 may be a plane of conductive carbon.

Six planes of the material 240 and seven planes of the second insulative material 245 are shown in FIG. 2A. The seventh plane of the second insulative material 245 may be a topmost layer of the memory array 200-a. The quantity of planes of the material 240 and the second insulative material 245 are not limited to the quantities illustrated in FIG. 2A. The material 240 and the second insulative material 245 may be arranged into more than six decks or less than six decks.

FIG. 2B illustrates a top view of a memory array 200-b along section line A-A' of FIG. 2A. FIG. 2B shows the formation trenches 250 through the alternating planes of material 240 (e.g., a conductive material, an insulative material) and the second insulative material 245 of memory array 200-b. The trench 250 may expose the substrate 104 and the conductive contacts 235 (previously shown in FIG. 2A) at the bottom of the trench 250. The trenches 250 may be etched from top to bottom and etched in a linear shape. In some cases, the trenches 250 may be formed by a combination of vertical and horizontal etching processes to form recesses within the trenches 250. Additional details about the etching processes and recesses are shown and described with reference to FIG. 2C. The trenches 250 may form a set of openings extending in a substantially parallel direction on each plane of the material 240 (e.g., word line plane, conductive layer).

FIG. 2C illustrates a side view of the memory array 200-b taken along the line B-B' of FIG. 2B. The memory array 200-b illustrates forming a set of recesses 215 in the material 240 (e.g., a conductive material, an insulative material) in each of the planes of memory array 200-b. For example, a selective etching operation may be performed to form the set of recesses 215 in sidewalls 290 and 291 of the trench 250 in an isotropic way. In some examples, the trench 250 includes a first sidewall 290 spaced apart from a second sidewall 291, where a first portion 292 of the first sidewall 290 formed by the first insulative material 245 is spaced apart from a first portion 293 of the second sidewall 291 formed by the first insulative material 245 by a first distance. A second portion 294 of the first sidewall 290 formed by the first material 240 may be spaced apart from a second portion 294 of the second sidewall 291 formed by the first material 240 by a second distance greater than the first distance. In some examples, portions of sidewalls 290 and 291 of the trench 250 formed by the first material 240 are recessed relative to portions of the sidewalls 290 and 291 of the trench 250 formed by the first insulative material 245.

The etching operations may include one or more vertical etching processes (e.g., an anisotropic etching process or a dry etching process, or a combination thereof) or horizontal etching processes (e.g., an isotropic etching process) or combinations thereof. For example, a vertical etching process may be performed to vertically etch the trench 250 to expose the substrate 104-b and one or more conductive contacts 235 and a horizontal etching process may be used to form at least one recess 215 in at least one material 240. The etching parameters may be selected such that the material 240, for example, is etched faster than the second insulative material 245.

FIG. 2D illustrates a side view of the memory array 200-b taken along the line B-B' of FIG. 2B. The memory array 200-c illustrates forming a conformal material 220 (e.g., a sacrificial material or sacrificial layer). The conformal material 220 may be deposited into the trench 250 of memory array 200-c. The conformal material 220 may be formed in the recesses 215 as shown in FIG. 2C by conformally depositing the conformal material 220. The conformal material 220 contacts a first sidewall 290, a second sidewall 291, and a bottom wall 295 of each trenches 250 (e.g., in contact with the substrate 104-b and contact 235). Although FIG. 2D shows the conformal material 220 formed on the sidewalls of the trench 250 (e.g., on the surfaces of the second insulative material 245 and the materials 240 in different layers facing into the trench 250), examples are not so limited. For example, the conformal material 220 may be confined to the set of recesses 215 in the materials 240 (e.g., conductive materials, insulative materials) in different layers in some cases. In some cases, the conformal material 220 may be referred to as a conformal layer or a sacrificial layer.

In some cases, an etching operation may be performed subsequent to forming the conformal material 220. In the etching operation, the conformal material 220 may be etched to form an opening or trench 250. The etch operation may result in the surfaces of the conformal material 220 (e.g., the surfaces facing the trench 250) being spaced apart from the surfaces of the second insulative material 245 (e.g., the surfaces facing into the trench 250). In some cases, the etch operation may result in the surfaces of the conformal material 220 (e.g., the surfaces facing the trench 250) being approximately coplanar with surfaces of the second insulative material 245 (e.g., the surfaces facing into the trench 250), and thereby forming a continuous sidewall of trench. The etch operation may further result in the substrate 104-b and the contact 235 being exposed (e.g., removing the conformal material 220 from bottom wall 295 of the trenches 250. The etching operations described herein may be vertical etching processes (e.g., an anisotropic etching process or a dry etching process, or a combination thereof) or horizontal etching processes (e.g., an isotropic etching process). For example, a vertical etching process may be performed to vertically etch the trench 250 and a horizontal etching process may be used to form at least one recess in the first material 240 (e.g., the first conductive material 240, a sacrificial insulative material 240).

FIG. 2E illustrates a side view of the memory array 200-b taken along the line B-B' of FIG. 2B. The memory array 200-d illustrates depositing a dielectric material 218 in the trench 250 on top of the conformal material 220 of the memory array 200-d. The dielectric material 218 may contact the conformal material 220. The dielectric material 218 may further contact one or more contacts 235. The dielectric material 218 and the conformal material 220 may cooperate to fill the trench 250. In some cases, the dielectric material 218 may be an example of an insulative material. In some examples, the conformal material 220 may be etched back selectively to form a co-planar surface with the dielectric material 218. The depth of the recession may be defined depending on a desired thickness.

FIG. 2F illustrates a top view of the example memory array 200-d along section line A-A' of FIG. 2E. FIG. 2F illustrates the memory array 200-d after the dielectric material 218 is deposited into a set of trenches 250. Each of the trenches 250 of memory array 200-d are lined with the conformal material 220 and filled with the dielectric material 218. The trenches 250 may extend through each of the layers of the material 240 (e.g., the conductive material 240, the sacrificial insulative material 240) as shown in FIG. 2E.

FIGS. 3A-3H illustrate various views of example memory arrays 200-e, 200-f, 200-g, and 200-h during a series of steps or processes that may be performed to form a stacked memory device, in accordance with examples as disclosed herein. Specifically, in FIGS. 3A-3H, a process of forming memory cells in the memory array 200-d (e.g., illustrated in FIGS. 2D and 2E) is shown.

Figure 3A:
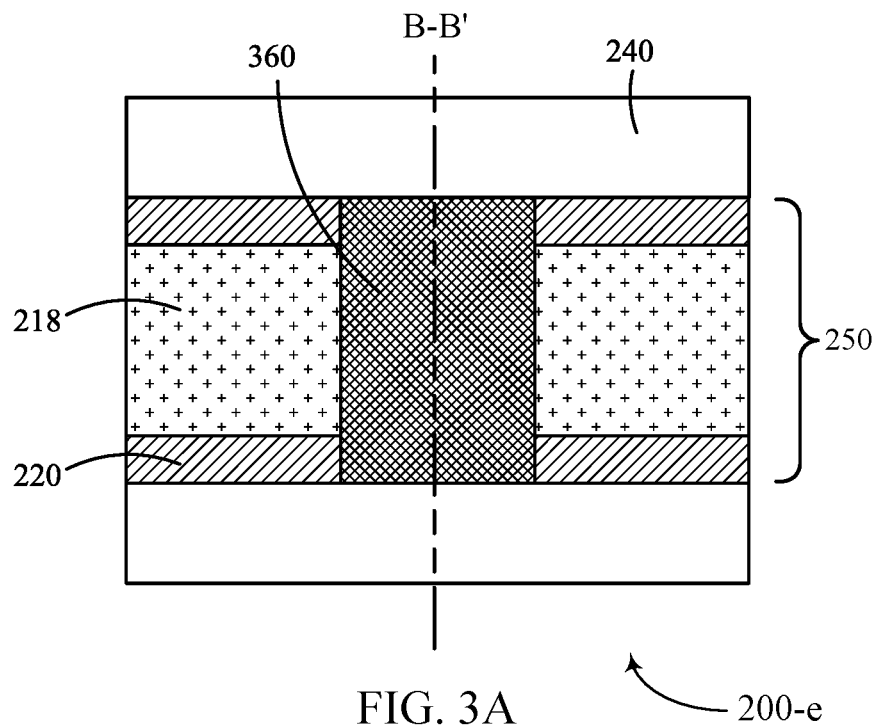
FIGS. 3A through 3H illustrate various views of example memory arrays that support split pillar architectures for memory devices in accordance with examples as disclosed herein.
Figure 3B:
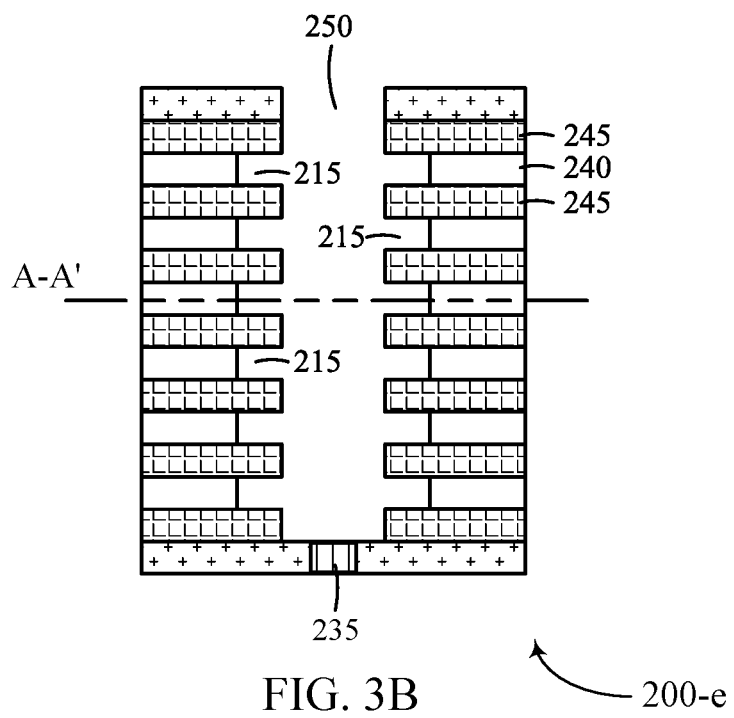
Figure 3C:
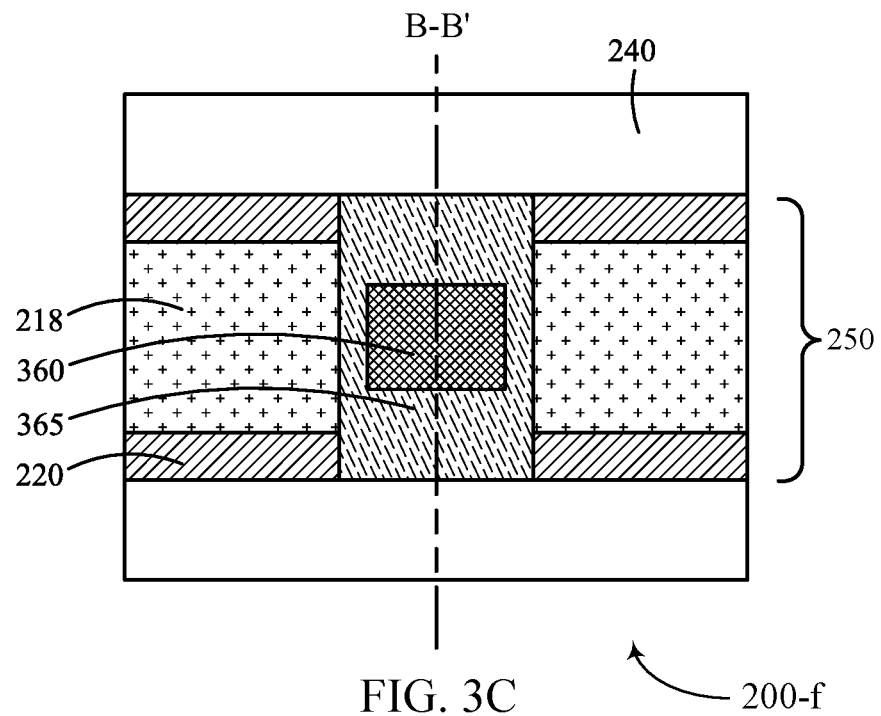
Figure 3D:
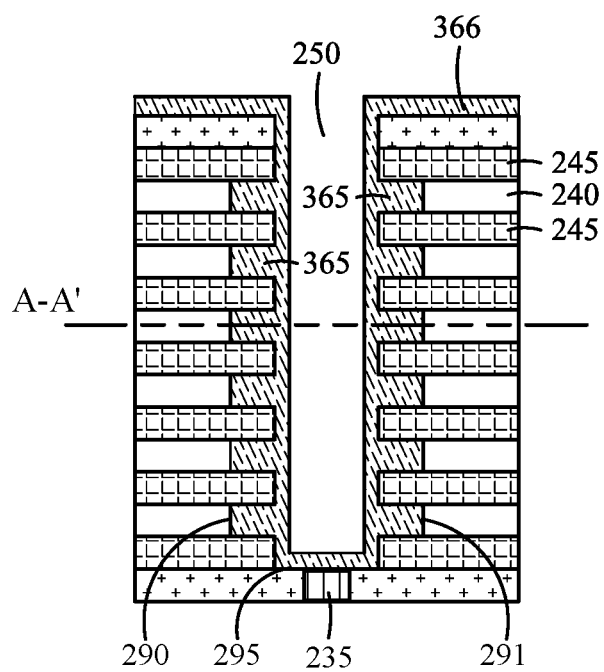
Figure 3E:
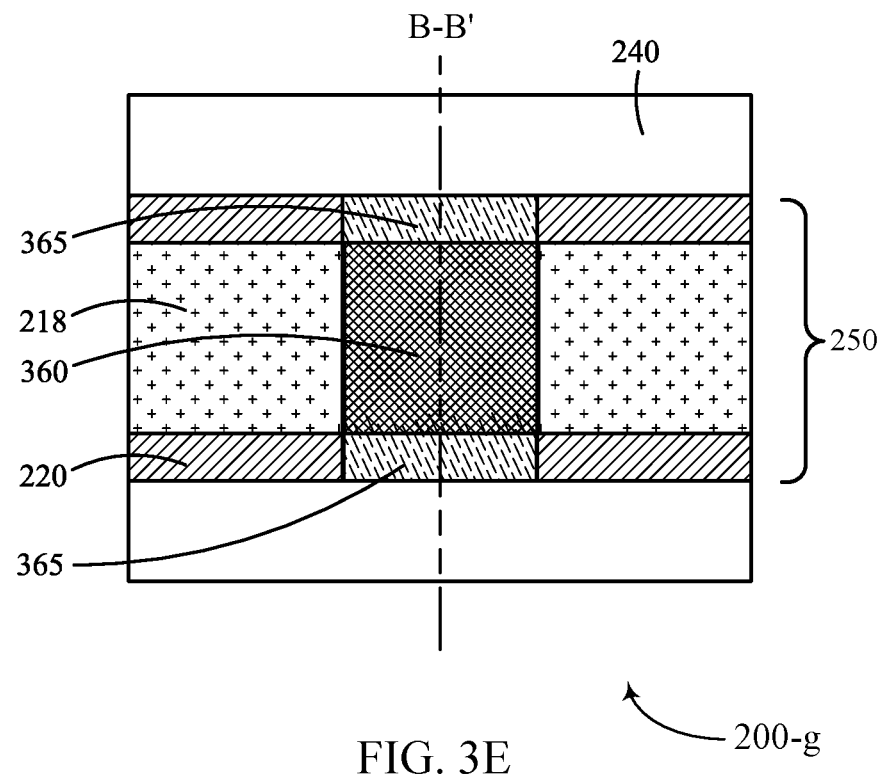
Figure 3F:
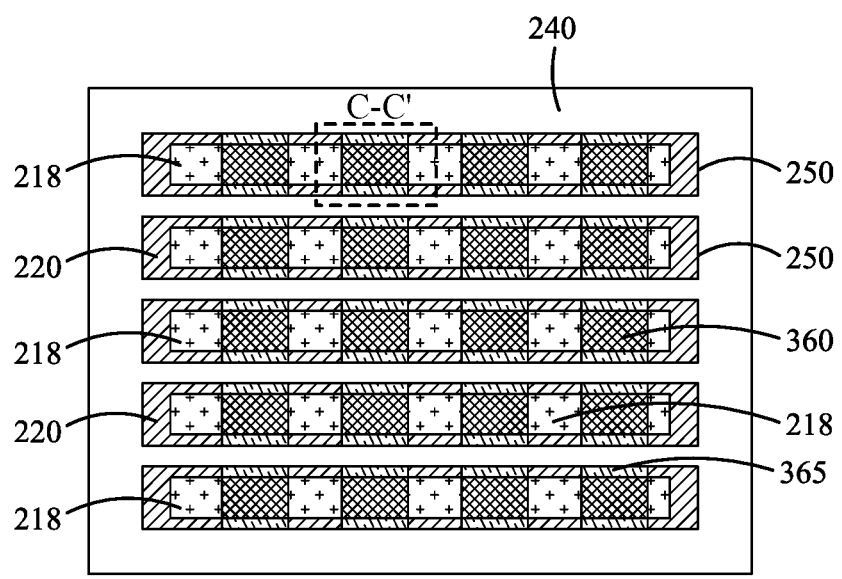
Figure 3G:
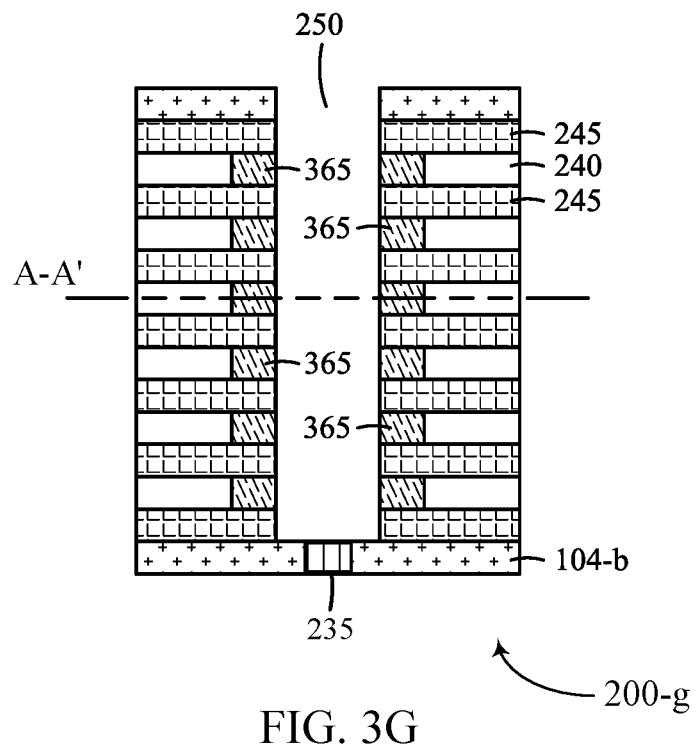
Figure 3H:
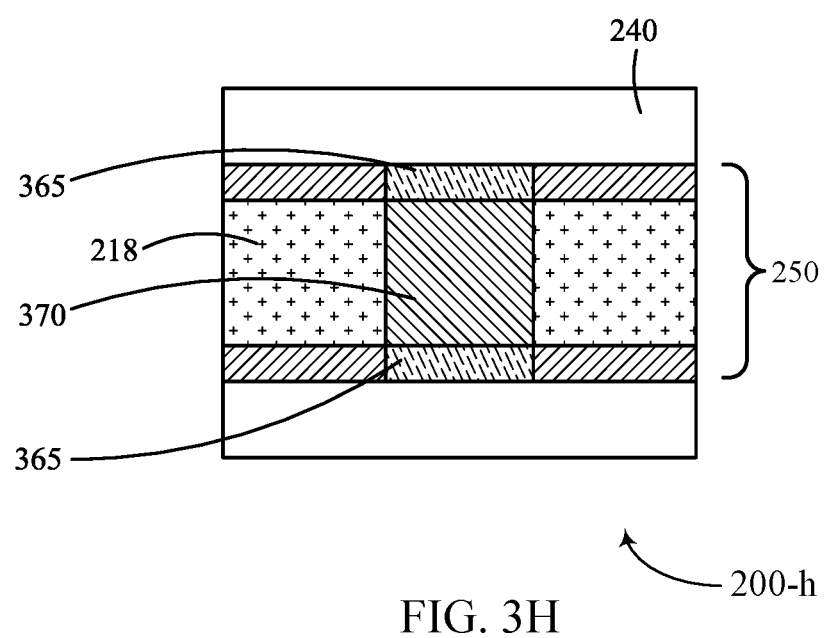

FIG. 3A illustrates a section C-C' of FIG. 2F of the top view of an example memory array 200-e during a process step subsequent to what is illustrated in FIG. 2F. FIG. 3B illustrates a cross-sectional view of the example memory array 200-*e* along section line B-B' of FIG. 3A. FIGS. 3C and 3D illustrate an example memory array 200-*f* during a process step subsequent to what is illustrated in FIGS. 3A and 3B. FIG. 3C illustrates a section C-C' (illustrated in FIG. 2F) of the top view of the example memory array 200-*f* and FIG. 3D illustrates a cross-sectional view of the example memory array 200-*f* along section line B-B' of FIG. 3C. FIGS. 3E, 3F, and 3G illustrate an example memory array 200-*g* during a process step subsequent to what is illustrated in FIGS. 3C and 3D. FIG. 3E illustrates a section C-C' (illustrated in FIG. 2F) of the top view of the example memory array 200-*g* (e.g., along section line A-A' of FIG. 3D). FIG. 3F illustrates the top view of the example memory array 200-*g* and FIG. 3G illustrates a cross-sectional view of the example memory array 200-*g* along section line B-B' of FIG. 3E. FIG. 3H illustrates a section C-C' of FIG. 3F of the top view of an example memory array 200-*h* during a process step subsequent to what is illustrated in FIGS. 3E, 3F, and 3G.

FIG. 3A illustrates a section C-C' of FIG. 2F of the top view of an example memory array 200-*e*. Example memory array 200-*e* may show the section C-C' of the example memory array 200-*d* as shown in FIG. 2F during a processing step subsequent to what is illustrated in FIGS. 2E and 2F. Opening 360 may be formed in a trench 250 by etching away a portion of the dielectric material 218 and/or the conformal material 220. The opening 360 may be positioned over one or more of the contacts 235 so that forming the opening 360 exposes at least a portion of one of the contacts 235. Additional details about the relationship between the openings 360 and the contacts 235 is shown and described with reference to FIG. 3B. In some cases, the example memory array 200-*e* may include a set of openings 360. For example, a set of openings may be formed at intervals along each of the trenches 250. Each of the openings 360 within a trench 250 may be separated from other openings in the trench 250 by the dielectric material 218. The etching process to form the openings 360 may be a vertical etching process. In some examples, the etching operation may not etch away all portions of the conformal material 320, for example, where the openings 360 are not formed FIG. 3B illustrates a side view of the memory array 200-*e* taken along the line B-B' of FIG. 3A. As shown in FIG. 3B, a set of recesses 215 may be formed in the material 240 in each of the planes. The set of recesses 215 may be formed during a formation of the openings 360 (e.g., as discussed with reference to FIG. 3A). For example, a selective etching operation may be performed to form the set of recesses 215 in a full or partially isotropic way. The etching chemistry may be selected to selectively reach a material 240. The contacts 235 may be exposed by forming the openings 360 in in the trench 250.

FIG. 3C illustrates a top view of section C-C' illustrated in FIG. 2F of an example memory array 200-*f* in accordance with examples as disclosed herein. The top view may be a view taken along section line A-A' of FIG. 3B. Example memory array 200-*f* may be formed subsequent to the processing step illustrated in FIGS. 3A and 3B by example memory array 200-*e*. As shown in FIG. 3C, a storage element material 365 may be formed in the opening 360. In some cases, the storage element material 365 may extend to contact each sidewall of the material 240. The storage element material 365 may further contact the conformal material 220 and the dielectric material 218. Forming the storage element material 365 in the opening 360 (e.g., by depositing the storage element material 365 in the opening 360) may decrease the size of the opening 360.

The storage element material 365 may be an example of a chalcogenide material, such as a chalcogenide alloy and/or glass, that may serve as a self-selecting storage element material (e.g., a material that may serve as both a select device and a storage element). For example, the storage element material 365 may be responsive to an applied voltage, such as a program pulse. For an applied voltage that is less than a threshold voltage, the storage element material 365 may remain in an electrically nonconductive state (e.g., an "off" state). Alternatively, responsive to an applied voltage that is greater than the threshold voltage, the storage element material 365 may enter an electrically conductive state (e.g., an "on" state).

FIG. 3D illustrates a side view of the memory array 200-*f* taken along the line B-B' of FIG. 3C. A storage element material 365 may be formed in the set of recesses 215 by conformally depositing the storage element material 365 into the trench 250. The storage element material 365 may be deposited to contact sidewalls 290 and 291 and a bottom wall 295 of the trench 250 exposed by the etching of the conformal material 320. When the storage element material 365 contacts the bottom wall 295 of the trench 250, the storage element material 365 covers the exposed contacts 235. The storage element material 365 may include a top layer 366.

FIG. 3E illustrates a section C-C' (illustrated in FIG. 2F) of the top view of the example memory array 200-*g* (e.g., along section line A-A'). An etching operation may be performed on the example memory array 200-*f* illustrated in FIGS. 3C and 3D to generate example memory array 200-*g*. The etching operation may remove portions of the storage element material 365 to create storage element components (e.g., including the storage element material 365). Each of the storage element components of the storage element material 365 may be in contact with a layer of the material 240 (e.g., a conductive material 240). In some examples, portions of the conformal material 220 may be located on either side of the storage element component of the storage element material 365. The etching of the storage element material 365 may separate the storage element components of the storage element material 365 by opening 360. The storage element components may enable the memory array 200-*g* (and memory arrays 200 formed by processing steps subsequent to memory array 200-*g*) to store data. That is, the storage element component may include the storage element material 365 and may be configured to store a logic state (e.g., a logic value '0' or logic value '1').

The storage element component may be programmed to a target state by applying a pulse (e.g., a programming pulse) that satisfies a programming threshold. The amplitude, shape, or other characteristics of the programming pulse may be configured to cause the storage element material 365 to exhibit the target state. For example, after applying the programming pulse, the ions of the storage element component may be redistributed throughout the storage element, thereby altering a resistance of the memory cell detected when a read pulse is applied. In some cases, the threshold voltage of the storage element component may vary based on applying the programming pulse.

The state stored by the storage element component may be sensed, detected, or read by applying read pulse to the storage element component. The amplitude, shape, or other characteristics of the read pulse may be configured to allow a sense component to determine what state is stored on the storage element component. For example, in some cases, the amplitude of the read pulse is configured to be at a level that the storage element component will be in an "on" state (e.g., current is conducted through the material) for a first state but will be in an "off" state (e.g., little to no current is conducted through the material) for a second state.

In some cases, the polarity of the pulse (whether programming or read) applied to the storage element component may affect the outcomes of the operation being performed. For example, if the storage element component stores a first state, a read pulse of a first polarity may result in the storage element component exhibiting an "on" state while a read pulse of a second polarity may result in the storage element component exhibiting an "off" state. This may occur because of the asymmetrical distributions of ions or other material in the storage element component when it is storing a state. Similar principles apply to programming pulses and other pulses or voltages.

Examples of chalcogenide materials that may serve as the storage element component include indium (In)-antimony (Sb)-tellurium (Te) (IST) materials, such as $In_2Sb_2Te_5$, $In_1Sb_2Te_4$, $In_1Sb_4Te_7$, etc., and germanium (Ge)-antimony (Sb)-tellurium (Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. Other examples of chalcogenide materials may include tellurium-arsenic (As)-germanium (OTS) materials, Ge, Sb, Te, silicon (Si), nickel (Ni), gallium (Ga), As, silver (Ag), tin (Sn), gold (Au), lead (Pb), bismuth (Bi), indium (In), selenium (Se), oxygen (O), Sulphur (S), nitrogen (N), carbon (C), yttrium (Y), and scandium (Sc) materials, and combinations thereof. The hyphenated chemical composition notation, as used herein, indicates the elements included in a particular mixture or compound, and is intended to represent all stoichiometries involving the indicated elements. In some examples, the chalcogenide material may be a chalcogenide glass or amorphous chalcogenide material. In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms. In some examples, conductivity may be controlled through doping using various chemical species. For example, doping may include incorporating a Group 3 (e.g., boron (B), gallium (Ga), indium (In), aluminum (Al), etc.) or Group 4 (tin (Sn), carbon (C), silicon (Si), etc.) element into the composition.

FIG. 3F illustrates a top view of the example memory array 200-g along section line A-A' of FIG. 3D. FIG. 3F includes the section C-C' illustrated in FIG. 3E. Example memory array 200-g shows a set of trenches 250. Each of the trenches 250 includes a set of storage element components of the storage element material 365. The set of storage element components may be separated from other storage element components by openings 360 and dielectric material 218. The storage element components may be in contact with the conformal material 220.

FIG. 3G illustrates a side view of the memory array 200-g taken along the line B-B' of FIG. 3F. The etching operation may be performed subsequent to forming the storage element material 365 (e.g., as discussed with reference to FIGS. 3C and 3D) so that surfaces of the storage element material 365 (e.g., the surfaces facing into the trench 250) are approximately coplanar with surfaces of the layers of insulative material 245 (e.g., the surfaces facing into the trench 250). The etching of the storage element material 365 may form a continuous sidewall and remove the top layer 366 of the storage element material 365 as shown in FIG. 3D. The etching of the storage element material 365 may also expose the contacts 235 in the substrate 104-b.

The portions of the storage element material 365 positioned in the recesses may correspond to storage element components. In each recess, each storage element component of the storage element material 365 may contact a single conductive material 240 (e.g., a single conductive material 240 located adjacent to the cell of the storage element material 365) and at least two dielectric layers (e.g. a top insulative material 245 located on top of the storage element component of the storage element material 365 and a bottom insulative material 245 located on bottom of the storage element component of the storage element material 365). In some cases, each storage element component of the storage element material 365 may contact a single material 240. Here, the material 240 may subsequently (e.g., during a process step subsequent to what is illustrated in FIG. 3G) be removed and replaced by a conductive material. The etching of the storage element material 365 may the storage element components of the storage element material 365. The etching of the storage element material 365 may also expose the contacts 235 in the substrate 104-b.

FIG. 3H illustrates a section C-C' (illustrated in FIG. 3F) of the top view of an example memory array 200-h during a process step subsequent to what is illustrated in FIGS. 3E, 3F, and 3G. As shown in FIG. 3H, a conductive material 370 is deposited into openings 360. The conductive material 370 may form a conductive pillar extending from a first substrate (e.g., substrate 104-a as illustrated with reference to FIG. 2C) to a second substrate (e.g., substrate 104-b). In some implementations, the conductive material 370 contacts at least one portion of the layers of insulative material 245 and the storage element material 365 as shown in FIG. 3G. In some examples, the conductive material 370 is compatible with an active material. The conductive material 370 may be a uniform conductive material (e.g., a conformal conducive material), or a barrier layer with an internal material (e.g., where the barrier layer surrounds the conductive material).

In a case that the conductive material 370 includes a barrier layer and an internal material, a barrier material may be deposited into openings 360. In some implementations, the barrier material may contact at least one portion of the insulative material 245 and the storage element material 365 as shown in FIG. 3G. In some examples, the barrier material may be compatible with an active material. The barrier material may be a conductive material (e.g., a conformal conducive material), or a barrier layer with a conductive material. For example, the barrier material may comprise aluminum oxide. The internal material may be deposited in the opening 360 (e.g., to contact the barrier material) to form a conductive pillar. The internal material may be metallic (or semi-metallic) material or a semiconductor material such as a doped polysilicon material, among others. However, other metallic, semi-metallic, or semiconductor materials may be used. a metal material or a dielectric material.

The conductive material 370 may contact a first and second storage element component formed of storage element material 365. The pillar (e.g., of the conductive material 370) formed in each respective one of the set of openings 360 may be arranged to extend substantially orthogonal to the alternating planes of the material 240 and the insulative material 245. The storage element material 365 and the conductive pillar formed in each respective one of the set of openings 360 may be formed in a substantially square shape. Examples of the present disclosure are not limited to exact or quasi-exact square shapes. For instance, the storage element material 365 and the conductive pillar may be formed in any shape, including circles or oval shapes.

Figure 4A:
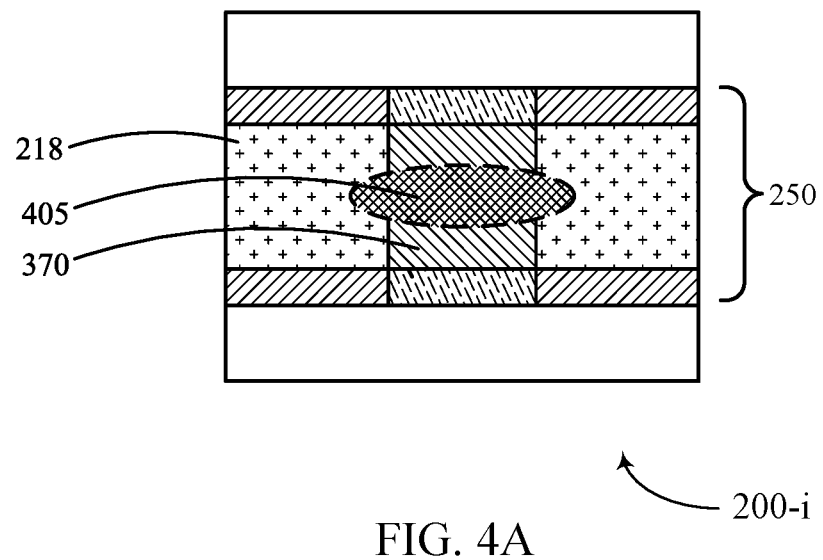
FIGS. 4A and 4B illustrate various views of example memory arrays that support split pillar architectures for memory devices in accordance with examples as disclosed herein.
Figure 4B:
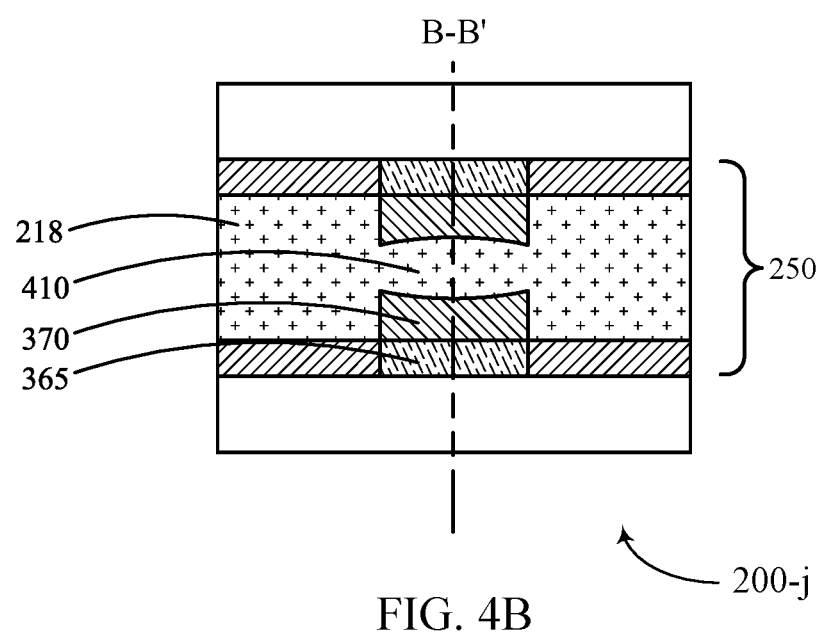

FIGS. 4A and 4B illustrate example memory arrays 200-*i* and 200-*j* during a series of steps or processes that may be performed to form a stacked memory device, in accordance with examples as disclosed herein. Specifically, FIGS. 4A and 4B illustrate processes for dividing conductive pillars to form digit lines in the memory array 200-*h* illustrated in FIG. 3H.

FIG. 4A illustrates a top view of an example memory array 200-*i* in accordance with examples as disclosed herein. A second opening 405 in trench 250 may be formed by etching away a portion of the conductive material 370. The etching process may further include etching away a portion of other materials. For example, the etching process may etch some (or all) of dielectric material 218. The etching process may include a vertical etching process that occurs substantially orthogonally to the alternating planes of the material 240 and the insulative material 245. For example, the etching process may include a single-gate vertical channel 3D not AND (SGVC) technique to create the ovular second opening of example memory array 200-*i*. The second opening 405 may extend to the bottom substrate (e.g., 104-*b*) to expose one or more contacts 235.

The second opening 405 may divide the pillar into a pair of pillars including a first pillar and a second pillar. Each pillar of the pair of pillars may correspond to a digit line. In some cases, the trench 250 may extend and include a set of second openings (e.g., separated by the dielectric material 218), where each opening divides the pillars into pairs of pillars. A size (e.g., a cross-sectional area) of each pillar of the pair of pillars may not affect an operation of the memory array 200-*i*. That is, a height of each pillar of the pair of pillars (e.g., extending from a first substrate such as substrate 104-*a* to a second substrate such as a substrate 104-*b*) may be relatively low (e.g., less than two micrometers).

FIG. 4B illustrates a top view of an example memory array 200-*j* in accordance with examples as disclosed herein. Memory array 200-*j* may be formed after depositing an insulative material 410 into the openings 405 shown in the memory array 200-*i* as described with reference to FIG. 4A. The insulative material 410 may be a dielectric material. In some cases, the insulative material 410 may be a same material as dielectric material 218. The insulative material 410 may contact the pillars formed of the conductive material 370. The insulative material 410 may extend from a top substrate (e.g., substrate 104-*a* shown in FIG. 2A) to the bottom substrate (e.g., substrate 104-*b* shown in FIG. 2A) thus isolating each pillar of a pair of pillars. The insulative material 410 may further extend to contact the insulative material 218. Here, an insulative material (e.g., the insulative material 410 in combination with the insulative material 218) may extend a length of the trench 250.

The insulative material 410 may isolate the pillars within a pillar pair from each other. This may decrease an effect of accessing a first storage element component on a second storage element component if the first and second storage element components are positioned in a same recess. The insulative material 410 may separate the storage element material 365 on either side of the trench 250. That is, the insulative material 410 may isolate (e.g., electrically) the memory cells (e.g., formed of the storage element material 365) contacting a first sidewall of the trench 250 from the memory cells contacting a second sidewall of the trench 250.

Figure 5A:
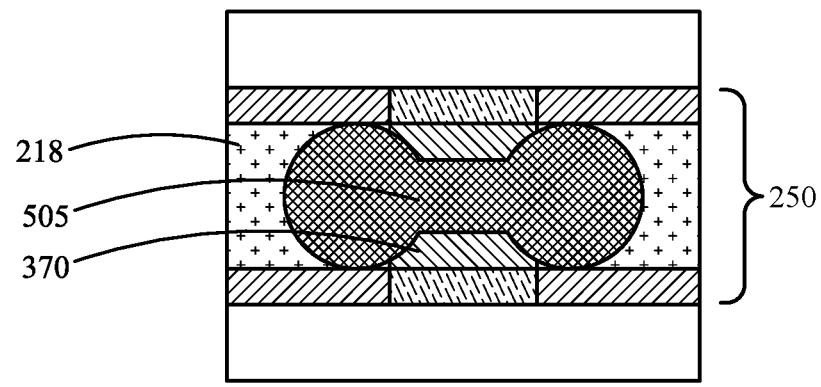
FIGS. 5A and 5B illustrate various views of example memory arrays that support split pillar architectures for memory devices in accordance with examples as disclosed herein.
Figure 5B:
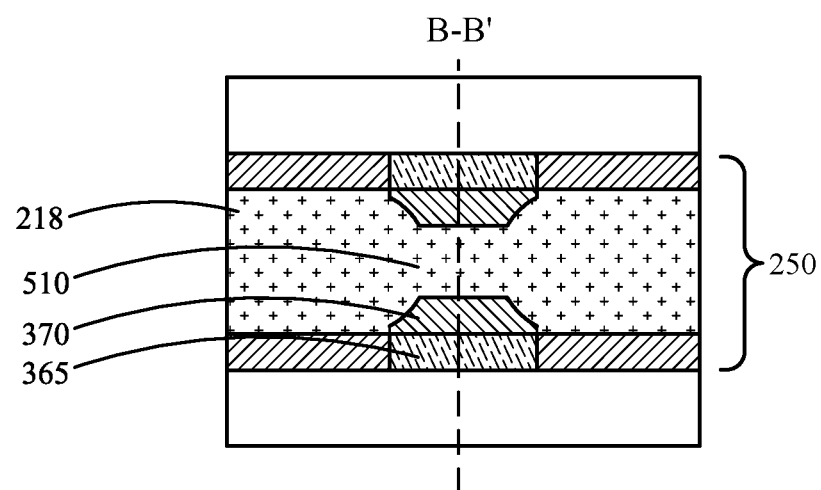

FIGS. 5A and 5B illustrate example memory arrays 200-*k* and 200-*l* during a series of steps or processes that may be performed to form a stacked memory device, in accordance with examples as disclosed herein. Specifically, FIGS. 5A and 5B illustrate other processes for dividing conductive pillars to form digit lines in the memory array 200-*h* illustrated in FIG. 3H.

FIG. 5A illustrates a top view of an example memory array 200-*k* in accordance with examples as disclosed herein. FIG. 5A may illustrate an embodiment different than an embodiment illustrated in FIG. 4A. In some other cases, a combination of FIG. 4A and FIG. 5A may be used. A second opening 505 in trench 250 may be formed by etching away a portion of the conductive material 370. The etching process may further include etching away a portion of other materials. For example, the etching process may etch some (or all) of dielectric material 218. The etching process may include a vertical etching process that occurs substantially orthogonally to the alternating planes of the material 240 and the insulative material 245. The etching process may create a dog-bone shaped second opening 505. In some cases, the etching process to create the second opening 505 may be different than an etching process used to create a different type of opening (e.g., the opening 405 as discussed with reference to FIG. 4A).

The second opening 505 may divide the pillar into a pair of pillars including a first pillar and a second pillar. Each pillar of the pair of pillars may correspond to a digit line. In some cases, the trench 250 may extend and include a set of second openings (e.g., separated by the dielectric material 218), where each opening divides pillars into pairs of pillars. A size (e.g., a cross-sectional area) of each pillar of the pair of pillars may not affect an operation of the memory array 200-*k*. That is, a height of each pillar of the pair of pillars (e.g., extending from a first substrate such as substrate 104-*a* to a second substrate such as a substrate 104-*b*) may be relatively low (e.g., less than two micrometers).

FIG. 5B illustrates a top view of an example memory array 200-*l* in accordance with examples as disclosed herein. Memory array 200-*l* may be formed after depositing an insulative material 510 into the openings 505 shown in the memory array 200-*k* as described with reference to FIG. 5A. The insulative material 510 may be a dielectric material. In some cases, the insulative material 510 may be a same material as dielectric material 218. The insulative material 510 may contact the pillars formed of the conductive material 370. The insulative material 510 may extend from a top substrate (e.g., substrate 104-*a* shown in FIG. 2A) to the bottom substrate (e.g., substrate 104-*b* shown in FIG. 2A) thus isolating each pillar of a pair of pillars. The insulative material 510 may further extend to contact the insulative material 218. Here, an insulative material (e.g., the insulative material 510 in combination with the insulative material 218) may extend a length of the trench 250.

The insulative material 510 may isolate the pillars within a pillar pair from each other. This may decrease an effect of accessing a first storage element component on a second storage element component if the first and second storage element components are positioned in a same recess. The insulative material 510 may separate the storage element material 365 on either side of the trench 250. That is, the insulative material 510 may isolate (e.g., electrically) the memory cells (e.g., formed of the storage element material 365) contacting a first sidewall of the trench 250 from the memory cells contacting a second sidewall of the trench 250.

Figure 6A:
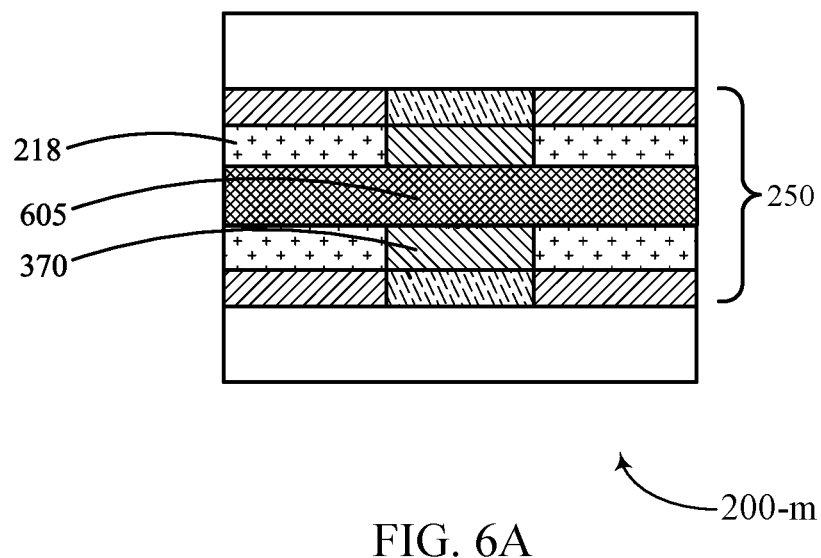
FIGS. 6A and 6B illustrate various views of example memory arrays that support split pillar architectures for memory devices in accordance with examples as disclosed herein.
Figure 6B:
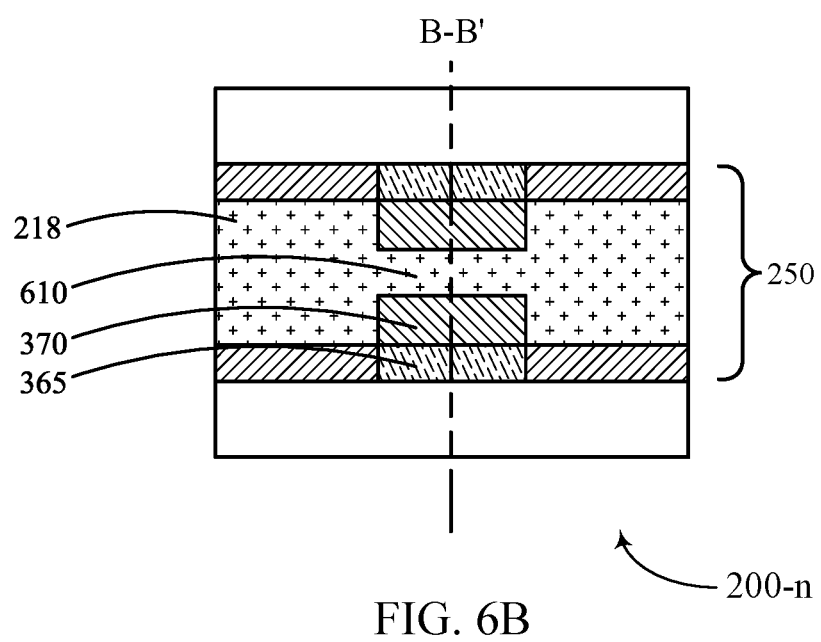

FIGS. 6A and 6B illustrate example memory arrays 200-*m* and 200-*n* during a series of steps or processes that may be performed to form a stacked memory device, in accordance with examples as disclosed herein. Specifically, FIGS. 6A and 6B illustrate other processes for dividing conductive pillars to form digit lines in the memory array 200-*h* illustrated in FIG. 3H.

FIG. 6A illustrates a top view of an example memory array 200-*m* in accordance with examples as disclosed herein. FIG. 6A may illustrate an embodiment different than the embodiments illustrated in FIGS. 4A through 5B. In some other cases, a combination of FIGS. 4A through 5B may be used. A second opening 605 in trench 250 may be formed by etching away a portion of the conductive material 370 and the dielectric material 218. The etching process may include a vertical etching process that occurs substantially orthogonally to the alternating planes of the material 240 and the insulative material 245. The etching process may create a second opening 605 that extends a length of the trench 250. For example, the trench 250 may include a set of conductive materials 370 separated by dielectric material 218. The second opening may be formed by etching a continuous opening through the set of conductive materials 370 and the dielectric material 218. The second opening 605 may extend to the bottom substrate (e.g., substrate 104-*b* shown in FIG. 2A) to expose one or more contacts 235. In some cases, the etching process to create the second opening 605 may be different than an etching process used to create a different type of opening (e.g., the opening 505 as discussed with reference to FIG. 4A, the opening 505 as discussed with reference to FIG. 5A).

The second opening 605 may divide the pillar into a pair of pillars including a first pillar and a second pillar. Each pillar of the pair of pillars may correspond to a digit line. In some cases, the trench 250 may extend and include a set of second openings (e.g., separated by the dielectric material 218), where each opening divides pillars into pairs of pillars. A size (e.g., a cross-sectional area) of each pillar of the pair of pillars may not affect an operation of the memory array 200-*m*. That is, a height of each pillar of the pair of pillars (e.g., extending from a first substrate such as substrate 104-*a* to a second substrate such as a substrate 104-*b*) may be relatively low (e.g., less than two micrometers).

FIG. 6B illustrates a top view of an example memory array 200-*n* in accordance with examples as disclosed herein. Memory array 200-*n* may be formed after depositing an insulative material 610 into the opening 605 shown in the memory array 200-*m* as described with reference to FIG. 6A. The insulative material 610 may be a dielectric material. In some cases, the insulative material 610 may be a same material as dielectric material 218. The insulative material 610 may contact the pillars formed of the conductive material 370. The insulative material 610 may extend from a top substrate (e.g., substrate 104-*a* shown in FIG. 2A) to the bottom substrate (e.g., substrate 104-*b* shown in FIG. 2A) thus isolating each pillar of a pair of pillars. The insulative material 610 may further extend to contact the insulative material 218. Here, an insulative material (e.g., the insulative material 410 in combination with the insulative material 218) may extend a length of the trench 250.

The insulative material 610 may isolate the pillars within a pillar pair from each other. This may decrease an effect of accessing a first storage element component on a second storage element component if the first and second storage element components are positioned in a same recess. The insulative material 610 may separate the storage element material 365 on either side of the trench 250. That is, the insulative material 610 may isolate (e.g., electrically) the memory cells (e.g., formed of the storage element material 365) contacting a first sidewall of the trench 250 from the memory cells contacting a second sidewall of the trench 250.

Figure 7A:
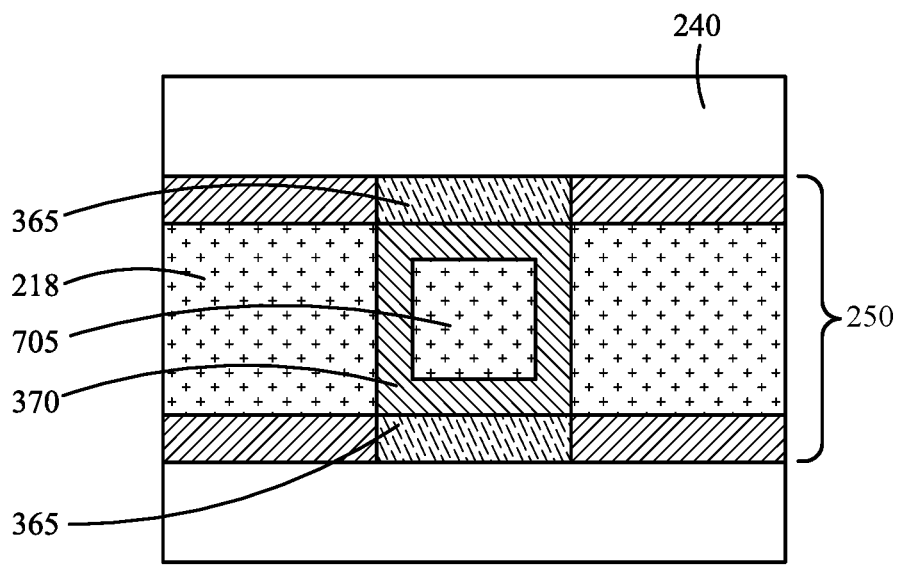
FIGS. 7A and 7B illustrate various views of example memory arrays that support split pillar architectures for memory devices in accordance with examples as disclosed herein.
Figure 7B:
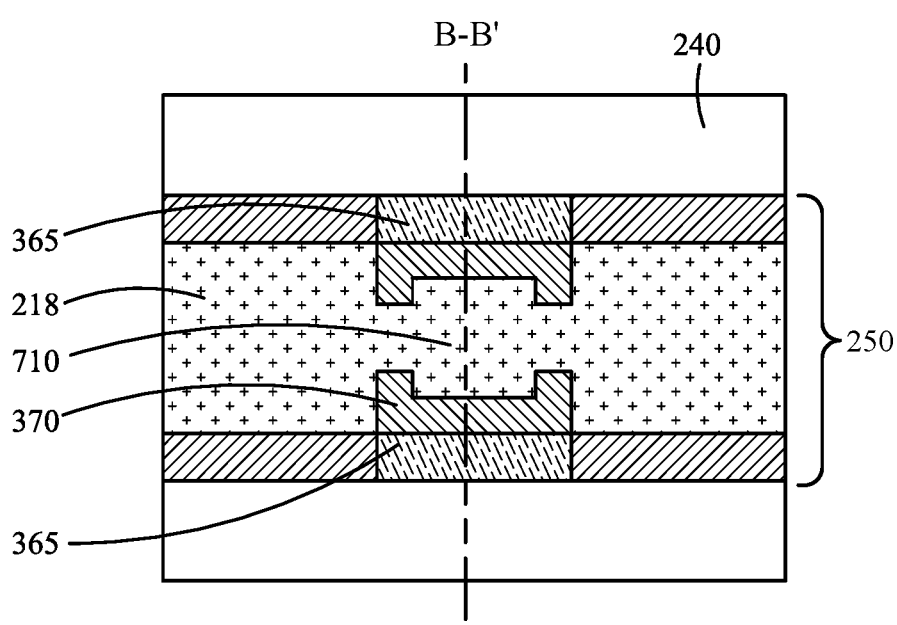

FIGS. 7A and 7B illustrate example memory arrays 200-*o* and 200-*p* during a series of steps or processes that may be performed to form a stacked memory device, in accordance with examples as disclosed herein. Specifically, FIGS. 6A and 6B illustrate other processes for dividing conductive pillars to form digit lines in the memory array 200-*g* illustrated in FIGS. 3E, 3F, and 3G.

FIG. 7A illustrates a top view of an example memory array 200-*o* in accordance with examples as disclosed herein. FIG. 7A may illustrate an embodiment different than the embodiments illustrated in FIGS. 3H through 5B. Additionally or alternatively, a combination of the memory arrays 200 illustrated in FIGS. 3H through 5B may be used. FIG. 7A may illustrate example memory array 200-*o* during a series of steps or processes that may be performed after FIG. 3G.

A conductive material 370 may be deposited into the opening 360 to form a conductive pillar. In some cases, the pillar may be partially filled by the conductive material 370 and subsequently filled by a dielectric material 705. In some cases, the dielectric material 705 may be the same as the dielectric material 218. The pillar may extend from a first substrate (e.g., substrate 104-*a*) to a second substrate (e.g., substrate 104-*b*).

The conductive material 370 may contact a first and second storage element component formed of storage element material 365. The pillar (e.g., of the conductive material 370 and the dielectric material 705) formed in each respective one of the set of openings 360 may be arranged to extend substantially orthogonal to the alternating planes of the material 240 and the insulative material 245.

FIG. 7B illustrates a top view of an example memory array 200-*p* in accordance with examples as disclosed herein. Memory array 200-*p* may be formed after forming a second opening and subsequently filling the second opening with the insulative material 710. In some cases, the dielectric material 705 and the insulative material 710 are examples of the same material. The second opening may be formed according to methods discussed with reference to FIGS. 4A, 5A, and/or 6A. The second opening may divide the pillar (e.g., comprising a conductive material 370 and dielectric material 705) into a pair of pillars including a first pillar and a second pillar. Each pillar of the pair of pillars may correspond to a digit line. A size (e.g., a cross-sectional area) of each pillar of the pair of pillars may not affect an operation of the memory array 200-*p*. That is, a height of each pillar of the pair of pillars (e.g., extending from a first substrate such as substrate 104-*a* to a second substrate such as a substrate 104-*b*) may be relatively low (e.g., less than two micrometers).

In some cases, the trench 250 may extend and include a set of second openings (e.g., separated by the dielectric material 218), where each opening divides pillars into pairs of pillars. The insulative material 710 may be a dielectric material. In some cases, the insulative material 710 may be a same material as dielectric material 218. The insulative material 710 may contact the pillars formed of the conductive material 370. The insulative material 710 may extend from a top substrate (e.g., substrate 104-*a* shown in FIG. 2A) to the bottom substrate (e.g., substrate 104-*b* shown in FIG. 2A) thus isolating each pillar of a pair of pillars. The insulative material 710 may further extend to contact the insulative material 218. Here, an insulative material (e.g., the insulative material 410 in combination with the insulative material 218) may extend a length of the trench 250.

The insulative material 710 may isolate the pillars within a pillar pair from each other. This may decrease an effect of accessing a first storage element component on a second storage element component if the first and second storage element components are positioned in a same recess. The insulative material 710 may separate the storage element material 365 on either side of the trench 250. That is, the insulative material 710 may isolate (e.g., electrically) the memory cells (e.g., formed of the storage element material 365) contacting a first sidewall of the trench 250 from the memory cells contacting a second sidewall of the trench 250.

Figure 8A:
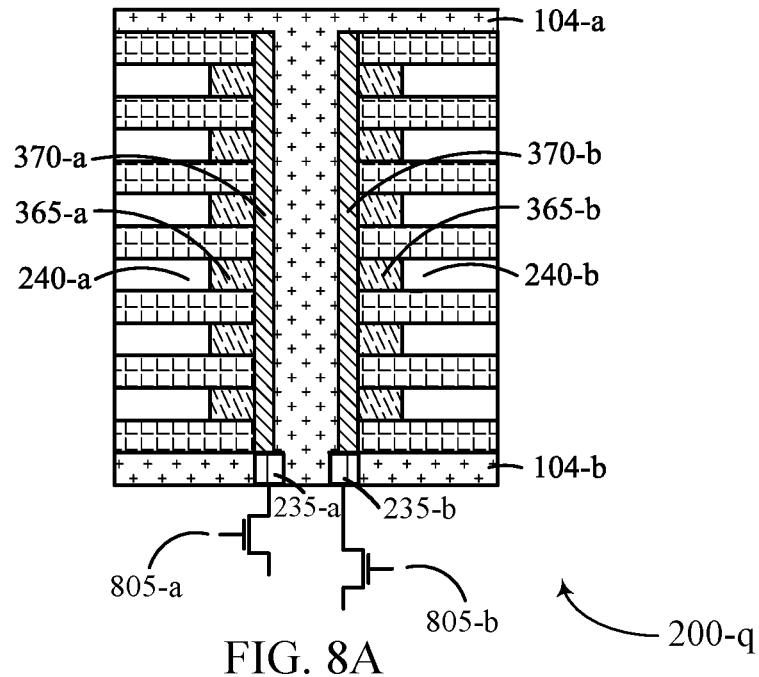
FIGS. 8A and 8B illustrate various views of example memory arrays that support split pillar architectures for memory devices in accordance with examples as disclosed herein.
Figure 8B:
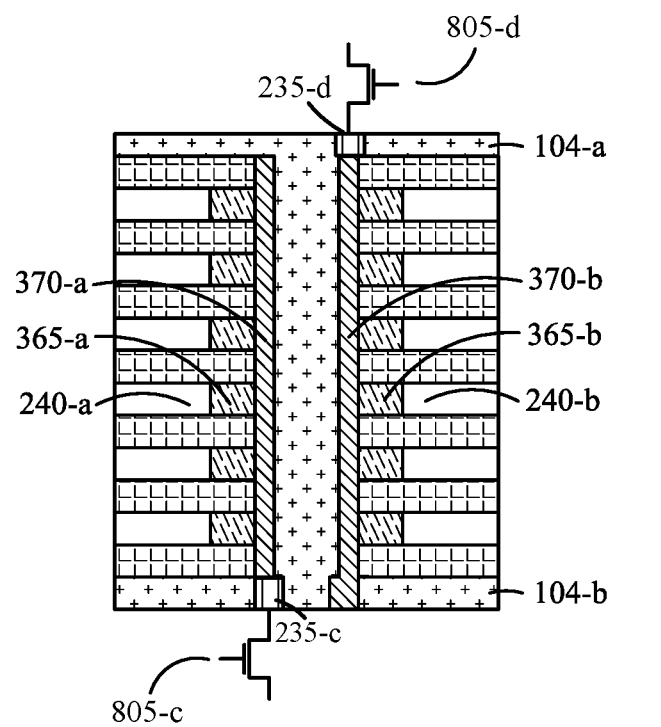

FIGS. 8A and 8B illustrate example memory arrays 200-q and 200-r that support split pillar architectures for memory devices in accordance with examples as disclosed herein. Specifically, FIGS. 8A and 8B illustrate various configurations for coupling a digit line to a digit line selector.

FIG. 8A illustrates a cross-sectional view of a memory array 200-q. The cross-sectional view may be along section line B-B' as shown in any of FIGS. 4B, 5B, 6B, and 7B. FIG. 8A illustrates a configuration of a memory device where each pillar of conductive material 370 (e.g., of a pair of pillars) contacts a contact 235 on a same substrate 104. The substrate 104-b is shown as positioned below the pillars of conductive material 370, but in some other cases, the contacts 235 may be formed through a substrate 104-a positioned above the pillars of conductive material 370.

Memory array 200-q may include a first pillar formed of conductive material 370-a in contact with contact 235-a of substrate 104-b. The contact 235-a may couple the pillar formed of conductive material 370-a to other circuitry such as sense components, decoders, or other circuitry. For example, the contact 235-a may couple the pillar (e.g., digit line) to transistor 805-a. The transistor 805-a may be an example of a digit line selector formed in a regular matrix. The transistor 805-a may be positioned to selectively couple or isolate the pillar (e.g., the digit line) at various times during access operations (e.g., a read operation, a write operation, a refresh operation). Activating the transistor 805-a may initiate an access operation of one of the storage element components formed of storage element material 365. For example, activating transistor 805-a and applying a voltage to material 240-a (e.g., applying a voltage to a conductive material by a word line driver) may access storage element component formed of storage element material 365-a. The material 240-a may be an example of a conductive material 240. In some cases, the material 240-a may have been deposited onto a stack (e.g., during a process step illustrated prior to FIG. 2A) as a conductive material. In some other cases, the material 240-a may have been deposited onto the stack as a sacrificial insulative material. In a subsequent process step, the material 240-a may have been removed and replaced with a conductive material 240-a.

Memory array 200-q may further include a second pillar formed of conductive material 370-b in contact with contact 235-b of substrate 104-b. The pillar formed of conductive material 370-a and the pillar formed of conductive material 370-b may be a pair of pillars. That is, the pillar formed of conductive material 370-a and the pillar formed of conductive material 370-b may be formed when a conductive pillar was divided by an etching process. The contact 235-b may couple the second pillar formed of conductive material 370-b to transistor 805-b, which may be an example of a digit line selector formed in a regular matrix. In some cases, the transistor 805-b may be at a same level (e.g., part of a same matrix) as the transistor 805-a. In some other cases, the transistor 805-b may be offset from the transistor 805-a. For example, the transistor 805-b may be positioned below the transistor 805-a.

FIG. 8B illustrates a cross-sectional view of a memory array 200-r. The cross-sectional view may be along section line B-B' as shown in any of FIGS. 4B, 5B, 6B, and 7B. FIG. 8B illustrates a configuration of a memory device where a first pillar of conductive material 370 (e.g., of a pair of pillars) contacts a contact 235 on a first substrate 104 and a second pillar of conductive material 370 (e.g., of a pair of pillars) contacts a contact 235 on a second substrate 104 different than the first substrate 104. The substrate 104-b is shown as positioned below the pillars of conductive material 370, but in some other cases, the contacts 235 may be formed through a substrate 104-a positioned above the pillars of conductive material 370.

Memory array 200-r may include a first pillar formed of conductive material 370-a in contact with contact 235-c of substrate 104-b. The contact 235-c may couple the pillar formed of conductive material 370-a to other circuitry such as sense components, decoders, or other circuitry. For example, the contact 235-c may couple the pillar (e.g., digit line) to transistor 805-c. The transistor 805-c may be an example of a digit line selector formed in a regular matrix. The transistor 805-c may be positioned to selectively couple or isolate the pillar (e.g., the digit line) at various times during access operations (e.g., a read operation, a write operation, a refresh operation). Activating the transistor 805-c may initiate an access operation of one of the storage element components formed of storage element material 365. For example, activating transistor 805-c and applying a voltage to material 240-a (e.g., applying a voltage to a conductive material by a word line driver) may access storage element component formed of storage element material 365-a. The material 240-a may be an example of a conductive material 240-a. In some cases, the material 240-a may have been deposited onto a stack (e.g., during a process step illustrated prior to FIG. 2A) as a conductive material. In some other cases, the material 240-a may have been deposited onto the stack as a sacrificial insulative material. In a subsequent process step, the material 240-a may have been removed and replaced with a conductive material 240-a.

Memory array 200-r may further include a second pillar formed of conductive material 370-b in contact with contact 235-d of substrate 104-a. The pillar formed of conductive material 370-a and the pillar formed of conductive material 370-b may be a pair of pillars. That is, the pillar formed of conductive material 370-a and the pillar formed of conductive material 370-b may be formed when a conductive pillar was divided by an etching process. The contact 235-d may couple the second pillar formed of conductive material 370-b to transistor 805-d, which may be an example of a digit line selector formed in a regular matrix.

Figure 9:
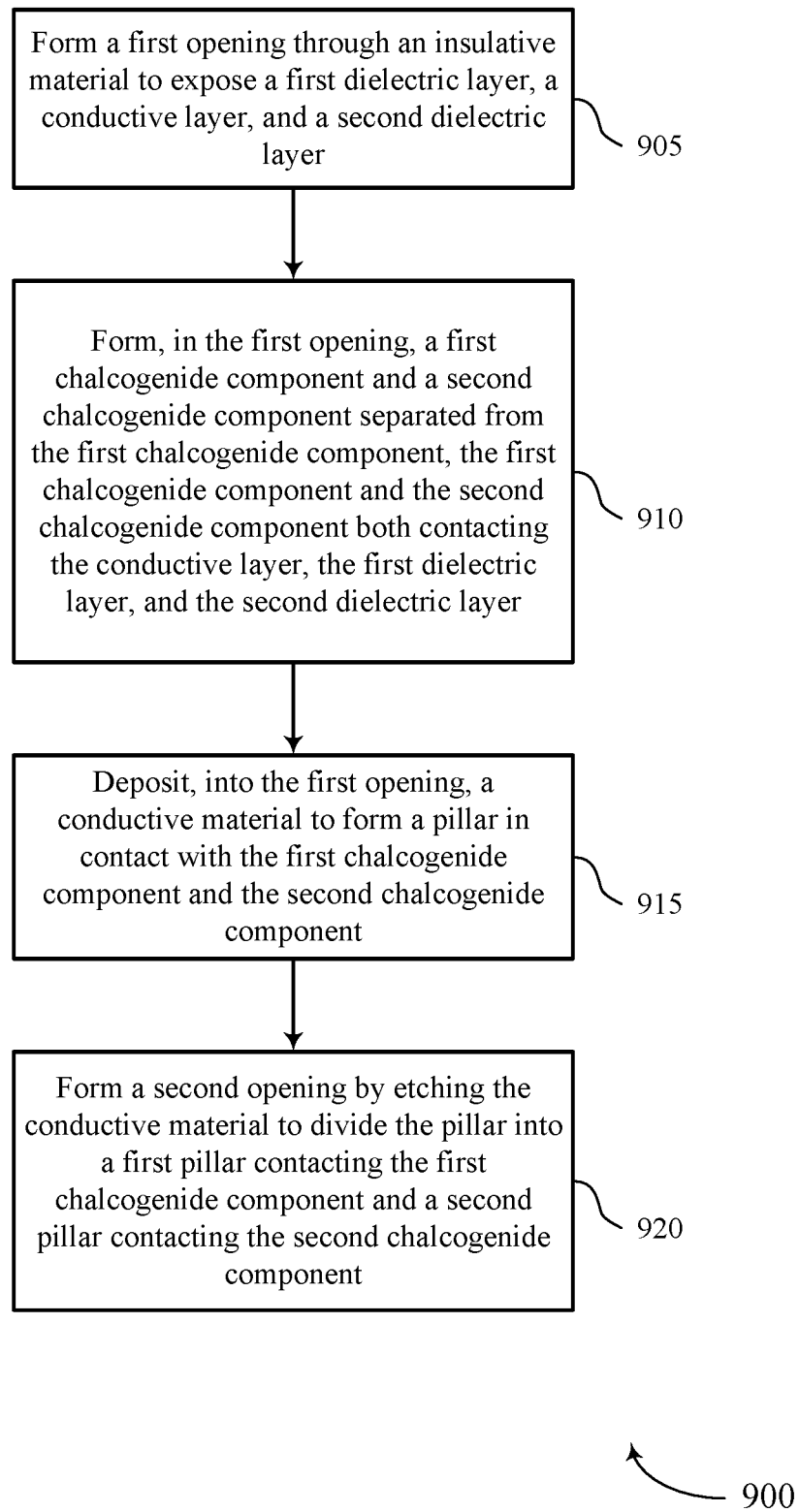
FIGS. 9 through 11 show flowcharts illustrating a method or methods that support split pillar architectures for memory devices in accordance with examples as disclosed herein.

FIG. 9 shows a flowchart illustrating a method or methods 900 that supports split pillar architectures for memory devices in accordance with examples as disclosed herein. The operations of method 900 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform portions of the described functions using special-purpose hardware.

At 905, the method 900 may include forming a first opening through an insulative material to expose a first dielectric layer, a conductive layer, and a second dielectric layer. The operations of 905 may be performed according to the methods described herein.

At 910, the method 900 may include forming, in the first opening, a first chalcogenide component and a second chalcogenide component separated from the first chalcogenide component, the first chalcogenide component and the second chalcogenide component both contacting the conductive layer, the first dielectric layer, and the second dielectric layer. The operations of 910 may be performed according to the methods described herein.

At 915, the method 900 may include depositing, into the first opening, a conductive material to form a pillar in contact with the first chalcogenide component and the second chalcogenide component. The operations of 915 may be performed according to the methods described herein.

At 920, the method 900 may include forming a second opening by etching the conductive material to divide the pillar into a first pillar contacting the first chalcogenide component and a second pillar contacting the second chalcogenide component. The operations of 920 may be performed according to the methods described herein.

In some examples, an apparatus as described herein may perform a method or methods, such as the method 900. The apparatus may include features, means, or instructions (e.g., a non-transitory computer-readable medium storing instructions executable by a processor) for forming a first opening through an insulative material to expose a first dielectric layer, a conductive layer, and a second dielectric layer, and forming, in the first opening, a first chalcogenide component and a second chalcogenide component separated from the first chalcogenide component, the first chalcogenide component and the second chalcogenide component both contacting the conductive layer, the first dielectric layer, and the second dielectric layer. the apparatus may further include features, means, or instructions for depositing, into the first opening, a conductive material to form a pillar in contact with the first chalcogenide component and the second chalcogenide component, and forming a second opening by etching the conductive material to divide the pillar into a first pillar contacting the first chalcogenide component and a second pillar contacting the second chalcogenide component.

Some examples of the method 900 and the apparatus described herein may further include operations, features, means, or instructions for depositing, into the second opening, a second insulative material contacting the insulative material, the first pillar, and the second pillar. In some cases of the method 900 and the apparatus described herein, forming the first chalcogenide component and the second chalcogenide component may include operations, features, means, or instructions for depositing a chalcogenide material into the first opening, the chalcogenide material contacting the insulative material, and etching the chalcogenide material to form the first chalcogenide component and the second chalcogenide component.

Some instances of the method 900 and the apparatus described herein may further include operations, features, means, or instructions for forming a set of contacts extending through a substrate in contact with the conductive layer, the set of contacts associated with a set of digit lines, where the forming the first opening through the insulative material exposes a first contact of the set of contacts. In some examples of the method 900 and the apparatus described herein, the first pillar may be formed over the one of the set of contacts, and the second pillar may be formed over a second contact of the set of contacts.

Some cases of the method 900 and the apparatus described herein may further include operations, features, means, or instructions for depositing a second substrate over the second dielectric layer, the second substrate in contact with the first pillar and the second pillar. The second substrate may include a second contact extending through the second substrate and in contact with the second pillar and the first pillar may be in contact with the first contact of the set of contacts of the substrate. In some instances of the method 900 and the apparatus described herein, depositing the conductive material to form the pillar further may include operations, features, means, or instructions for filling the first opening with the conductive material.

In some examples of the method 900 and the apparatus described herein, depositing the conductive material to form the pillar further may include operations, features, means, or instructions for partially filling the first opening with a conformal layer of the conductive material. Some cases of the method 900 and the apparatus described herein may further include operations, features, means, or instructions for forming a trench through the first dielectric layer, the conductive layer, and the second dielectric layer, and depositing a conformal layer that contacts a first sidewall and a second sidewall of the trench. The first chalcogenide component and the second chalcogenide component may both contact the conformal layer.

Some instances of the method 900 and the apparatus described herein may further include operations, features, means, or instructions for depositing, into the trench, the insulative material in contact with the conformal layer, the first dielectric layer, and the second dielectric layer. Forming the first opening through the insulative material may be based on depositing the insulative material. In some examples of the method 900 and the apparatus described herein, forming the trench through the first dielectric layer, the conductive layer, and the second dielectric layer may include operations, features, means, or instructions for performing a vertical etching process to vertically etch the trench, and performing a horizontal etching process after the vertical etching process to form at least one recess in the conductive layer.

Some cases of the method 900 and the apparatus described herein may further include operations, features, means, or instructions for portions of sidewalls of the trench formed by the conductive layer may be recessed relative to portions of the sidewalls of the trench formed by the first dielectric layer. Some instances of the method 900 and the apparatus described herein may further include operations, features, means, or instructions for forming a set of contacts extending through a substrate, the set of contacts associated with a set of digit lines, forming the first dielectric layer on the substrate, forming the conductive layer on the first dielectric layer, the conductive layer configured as a word line plate, and forming the second dielectric layer on the conductive layer. Forming the first opening may be based on forming the second dielectric layer.

In some examples of the method 900 and the apparatus described herein, the first chalcogenide component includes a first storage element for a self-selecting memory cell and the second chalcogenide component includes a second storage element for a self-selecting memory cell. Some cases of the method 900 and the apparatus described herein may further include operations, features, means, or instructions for forming a second conductive layer on the second dielectric layer, the second conductive layer configured as a word line plate, and forming a third conductive layer on the second conductive layer, where forming the first opening may be based on forming the third conductive layer. In some instances of the method 900 and the apparatus described herein, an array of memory cells associated with the conductive layer and the second conductive layer include a three-dimensional array of memory cells.

Figure 10:
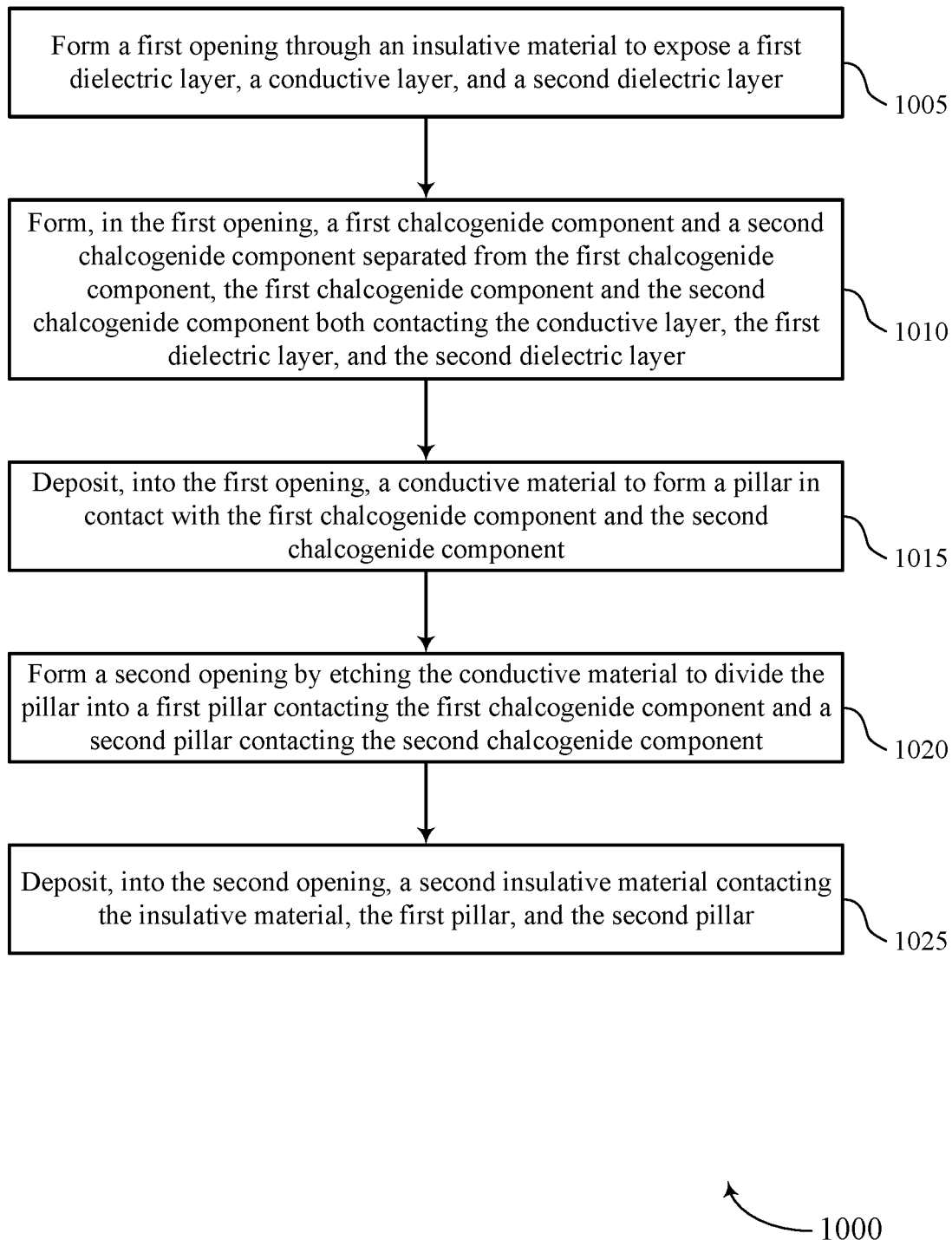

FIG. 10 shows a flowchart illustrating a method or methods 1000 that supports split pillar architectures for memory devices in accordance with examples as disclosed herein. The operations of method 1000 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform portions of the described functions using special-purpose hardware.

At 1005, the method 1000 may include forming a first opening through an insulative material to expose a first dielectric layer, a conductive layer, and a second dielectric layer. The operations of 1005 may be performed according to the methods described herein.

At 1010, the method 1000 may include forming, in the first opening, a first chalcogenide component and a second chalcogenide component separated from the first chalcogenide component, the first chalcogenide component and the second chalcogenide component both contacting the conductive layer, the first dielectric layer, and the second dielectric layer. The operations of 1010 may be performed according to the methods described herein.

At 1015, the method 1000 may include depositing, into the first opening, a conductive material to form a pillar in contact with the first chalcogenide component and the second chalcogenide component. The operations of 1015 may be performed according to the methods described herein.

At 1020, the method 1000 may include forming a second opening by etching the conductive material to divide the pillar into a first pillar contacting the first chalcogenide component and a second pillar contacting the second chalcogenide component. The operations of 1020 may be performed according to the methods described herein.

At 1025, the method 1000 may include depositing, into the second opening, a second insulative material contacting the insulative material, the first pillar, and the second pillar. The operations of 1025 may be performed according to the methods described herein.

Figure 11:
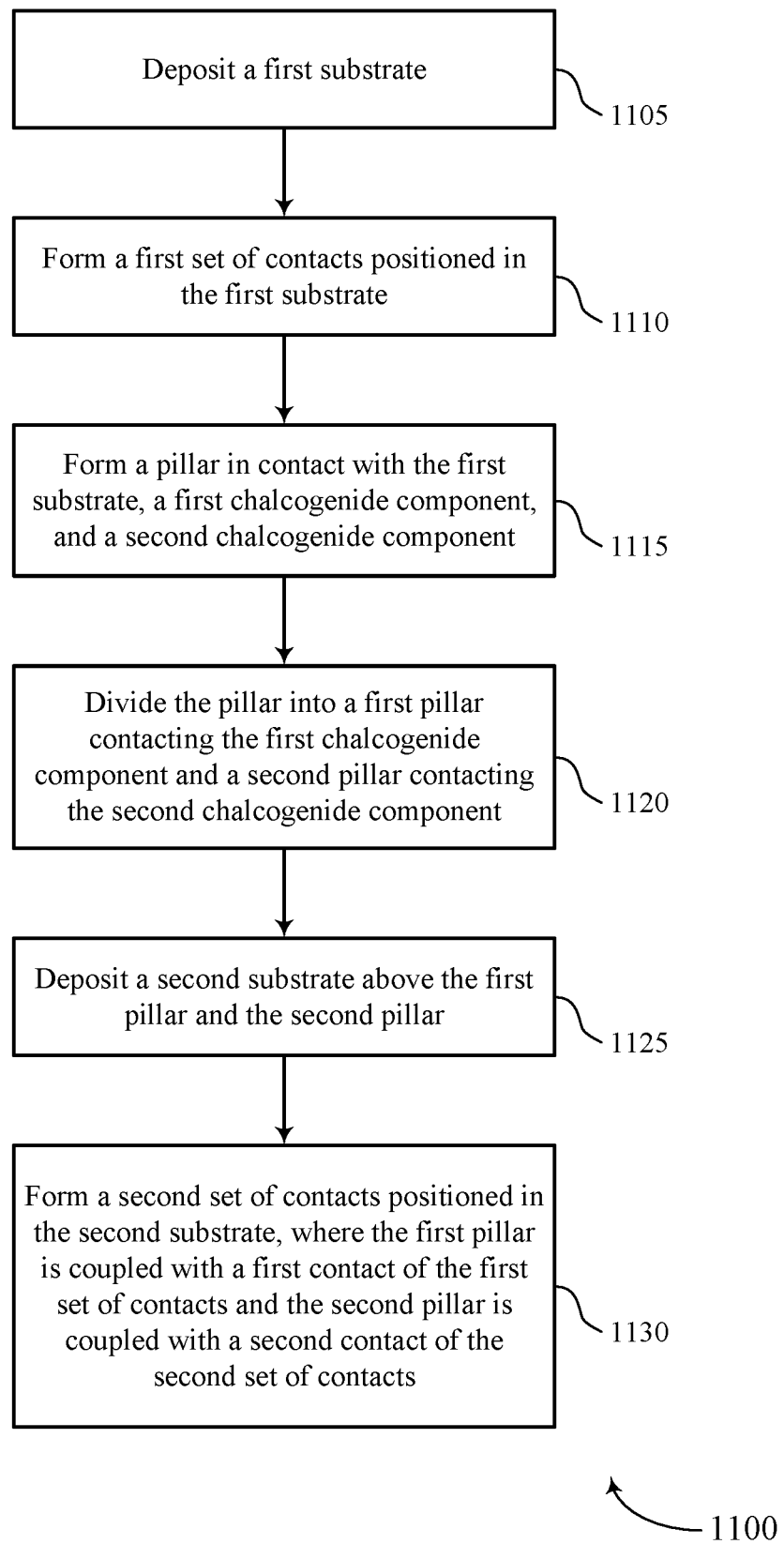

FIG. 11 shows a flowchart illustrating a method or methods 1100 that supports split pillar architectures for memory devices in accordance with examples as disclosed herein. The operations of method 1100 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform portions of the described functions using special-purpose hardware.

At 1105, the method 1100 may include depositing a first substrate. The operations of 1105 may be performed according to the methods described herein.

At 1110, the method 1100 may include forming a first set of contacts positioned in the first substrate. The operations of 1110 may be performed according to the methods described herein.

At 1115, the method 1100 may include forming a pillar in contact with the first substrate, a first chalcogenide component, and a second chalcogenide component. The operations of 1115 may be performed according to the methods described herein.

At 1120, the method 1100 may include dividing the pillar into a first pillar contacting the first chalcogenide component and a second pillar contacting the second chalcogenide component. The operations of 1120 may be performed according to the methods described herein.

At 1125, the method 1100 may include depositing a second substrate above the first pillar and the second pillar. The operations of 1125 may be performed according to the methods described herein.

At 1130, the method 1100 may include forming a second set of contacts positioned in the second substrate, where the first pillar is coupled with a first contact of the first set of contacts and the second pillar is coupled with a second contact of the second set of contacts. The operations of 1130 may be performed according to the methods described herein.

In some examples, an apparatus as described herein may perform a method or methods, such as the method 1100. The apparatus may include features, means, or instructions (e.g., a non-transitory computer-readable medium storing instructions executable by a processor) for depositing a first substrate, forming a first set of contacts positioned in the first substrate, forming a pillar in contact with the first substrate, a first chalcogenide component, and a second chalcogenide component, dividing the pillar into a first pillar contacting the first chalcogenide component and a second pillar contacting the second chalcogenide component, depositing a second substrate above the first pillar and the second pillar, and forming a second set of contacts positioned in the second substrate, where the first pillar is coupled with a first contact of the first set of contacts and the second pillar is coupled with a second contact of the second set of contacts.

Some cases of the method 1100 and the apparatus described herein may further include operations, features, means, or instructions for depositing an insulative material between the first pillar and the second pillar, the insulative material contacting the first substrate and the second substrate, where depositing the second substrate may be based on depositing the insulative material.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a word line plate, a set of storage element pairs, each pair of the set of storage element pairs including a first storage element contacting a first wall of the word line plate and a second storage element contacting a second wall of the word line plate. The apparatus may further include a set of pillar pairs configured as digit lines to interact with the word line plate, each pair of the set of pillar pairs including a first pillar in contact with the first storage element and a second pillar in contact with the second storage element. The apparatus may further include a dielectric material extending between each pillar pair of the set of pillar pairs and in contact with each pillar of the set of pillar pairs.

Some examples of the apparatus may include a set of contacts associated with a set of digit lines and extending through a substrate, where each first pillar of the set of pillar pairs may be in contact with one of the set of contacts. In some cases, each second pillar of the set of pillar pairs may be in contact with one of the set of contacts. Some instances of the apparatus may include a second set of contacts associated with a second set of digit lines and extending through a second substrate, where each second pillar of the set of pillar pairs may be in contact with one of the second set of contacts. In some cases, the set of contacts may be arranged in a grid.

Some examples of the apparatus may include a conformal material contacting the word line plate and extending between a first storage element of a first storage element pair and a first storage element of a second storage element pair. Some cases may further include storage elements of the set of storage element pairs may be positioned in recesses formed by the word line plate and a pillar of the pillar pair.

Some instances of the apparatus may include a dielectric layer positioned above the word line plate and in contact with the set of storage element pairs and the set of pillar pairs, where the set of pillar pairs extend through the dielectric layer. Some examples of the apparatus may include a second word line plate positioned above the dielectric layer, where the set of pillar pairs extend through the second word line plate, and a second set of storage element pairs, each pair of the second set of storage element pairs including a third storage element and a fourth storage element, where.

Some cases of the apparatus may include a substrate positioned below the word line plate, where the set of pillar pairs and the dielectric material contact the substrate. In some instances, the word line plate includes a conductive material. Some examples may further include storage elements of the set of storage element pairs include a chalcogenide material.

An apparatus is described. The apparatus may include a substrate, a set of contacts extending through the substrate and configured to couple digit lines with circuitry, a word line plate positioned above the substrate, and a set of storage element pairs. Each pair of the set of storage element pairs may include a first storage element contacting a first wall of the word line plate and a second storage element contacting a second wall of the word line plate opposite the first storage element. The apparatus may further include a set of pillar pairs coupled with the set of contacts and configured as the digit lines, each pair of the set of pillar pairs including a first pillar in contact with the first storage element and a first contact of the set of contacts and including a second pillar in contact with the second storage element and a second contact of the set of contacts. The apparatus may further include a dielectric material in contact with and extending between each pillar pair of the set of pillar pairs, the dielectric material in contact with the substrate.

Some examples of the apparatus may include a conformal material contacting the word line plate and extending between a first storage element of a first storage element pair and a first storage element of a second storage element pair.

An apparatus is described. The apparatus may include a first substrate and a second substrate, a first set of contacts positioned in the first substrate and a second set of contacts positioned in the second substrate, and a word line plate positioned between the first substrate and the second substrate. The apparatus may further include a set of storage element pairs positioned between the first substrate and the second substrate, each pair of the set of storage element pairs including a first storage element contacting a first wall of the word line plate and a second storage element contacting a second wall of the word line plate. The apparatus may further include a set of pillar pairs positioned between the first substrate and the second substrate and configured as digit lines. Each pair of the set of pillar pairs may include a first pillar in contact with the first storage element and a first contact of the first set of contacts positioned in the first substrate and including a second pillar in contact with the second storage element and a second contact of the second set of contacts positioned in the second substrate.

Some examples of the apparatus may include a dielectric material extending between each pillar pair of the set of pillar pairs, the dielectric material in contact with the first substrate, the second substrate, and each pillar of the set of pillar pairs.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a word line plate;
   a plurality of storage element pairs, each pair of the plurality of storage element pairs comprising a first storage element contacting a first wall of the word line plate and a second storage element contacting a second wall of the word line plate;
   a plurality of pillar pairs configured as digit lines to interact with the word line plate, each pair of the plurality of pillar pairs comprising a first pillar in contact with the first storage element and a second pillar in contact with the second storage element, and each pillar of the plurality of pillar pairs extending between a first insulating substrate and a second insulating substrate; and
   a dielectric material extending from the first insulating substrate and between each pillar pair of the plurality of pillar pairs and in contact with each pillar of the plurality of pillar pairs and the first insulating substrate.

2. The apparatus of claim 1, further comprising:
   a plurality of contacts associated with a plurality of digit lines and extending through the first insulating substrate, wherein each first pillar of the plurality of pillar pairs is in contact with one of the plurality of contacts.

3. The apparatus of claim 2, wherein each second pillar of the plurality of pillar pairs is in contact with one of the plurality of contacts.

4. The apparatus of claim 2, further comprising:
   a second plurality of contacts associated with a second plurality of digit lines and extending through a second substrate, wherein each second pillar of the plurality of pillar pairs is in contact with one of the second plurality of contacts.

5. The apparatus of claim 2, wherein the plurality of contacts are arranged in a grid.

6. The apparatus of claim 1, further comprising:
   a conformal material contacting the word line plate and extending between a first storage element of a first storage element pair and a first storage element of a second storage element pair.

7. The apparatus of claim 1, wherein:
   storage elements of the plurality of storage element pairs is positioned in recesses formed by the word line plate and a pillar of the pillar pair.

8. The apparatus of claim 1, further comprising:
   a dielectric layer positioned above the word line plate and in contact with the plurality of storage element pairs and the plurality of pillar pairs, wherein the plurality of pillar pairs extend through the dielectric layer.

9. The apparatus of claim 8, further comprising:
   a second word line plate positioned above the dielectric layer, wherein the plurality of pillar pairs extend through the second word line plate;
   a second plurality of storage element pairs, each pair of the second plurality of storage element pairs comprising a third storage element and a fourth storage element, wherein;
   the third storage element of each pair of the second plurality of storage element pairs contacts a third wall of the second word line plate and the first pillar; and
   the fourth storage element of each pair of the second plurality of storage elements contacts a fourth wall of the second word line plate and the second pillar.

10. The apparatus of claim 1,
    wherein the first insulating substrate is positioned below the word line plate, wherein the plurality of pillar pairs and the dielectric material contact the first insulating substrate.

11. The apparatus of claim 1, wherein the word line plate comprises a conductive material.

12. The apparatus of claim 1, wherein:
    storage elements of the plurality of storage element pairs comprise a chalcogenide material.

13. An apparatus, comprising:
    an insulating substrate;
    a plurality of contacts extending through the insulating substrate and configured to couple digit lines with circuitry;
    a word line plate positioned above the insulating substrate;
    a plurality of storage element pairs, each pair of the plurality of storage element pairs comprising a first storage element contacting a first wall of the word line plate and a second storage element contacting a second wall of the word line plate opposite the first storage element;
    a plurality of pillar pairs coupled with the plurality of contacts and configured as the digit lines, each pair of the plurality of pillar pairs comprising a first pillar in contact with the first storage element and a first contact of the plurality of contacts and comprising a second pillar in contact with the second storage element and a second contact of the plurality of contacts; and
    a dielectric material in contact with and extending between each pillar pair of the plurality of pillar pairs, the dielectric material in contact with the insulating substrate.

14. The apparatus of claim 13, further comprising:
    a conformal material contacting the word line plate and extending between a first storage element of a first storage element pair and a first storage element of a second storage element pair.

* * * * *